US012734784B2

(12) United States Patent
Okuno et al.

(10) Patent No.: US 12,734,784 B2
(45) Date of Patent: Sep. 15, 2026

(54) LAMINATE, RELEASE AGENT COMPOSITION, AND METHOD FOR PRODUCING PROCESSED SEMICONDUCTOR SUBSTRATE

(71) Applicant: NISSAN CHEMICAL CORPORATION, Tokyo (JP)

(72) Inventors: Takahisa Okuno, Toyama (JP); Takahiro Kishioka, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 71 days.

(21) Appl. No.: 18/703,895

(22) PCT Filed: Oct. 7, 2022

(86) PCT No.: PCT/JP2022/037649
§ 371 (c)(1),
(2) Date: Apr. 23, 2024

(87) PCT Pub. No.: WO2023/074324
PCT Pub. Date: May 4, 2023

(65) Prior Publication Data

US 2025/0065601 A1 Feb. 27, 2025

(30) Foreign Application Priority Data

Oct. 29, 2021 (JP) ................................ 2021-177168

(51) Int. Cl.
*B32B 7/06* (2019.01)
*B32B 43/00* (2006.01)
(Continued)

(52) U.S. Cl.
CPC .............. *B32B 7/06* (2013.01); *B32B 43/006* (2013.01); *C09J 7/30* (2018.01); *C09J 7/401* (2018.01);
(Continued)

(58) Field of Classification Search
CPC ................ B32B 17/10; B32B 2255/26; B32B 2307/414; B32B 2307/7376;
(Continued)

(56) References Cited

U.S. PATENT DOCUMENTS 8,038,839 B2 10/2011 Noda et al.
9,682,532 B2 6/2017 Kubo et al.
(Continued)

FOREIGN PATENT DOCUMENTS

JP 2004-64040 A 2/2004
JP 2010-99979 A 5/2010
(Continued)

OTHER PUBLICATIONS

Translation of abstract of JP2017050322.*
(Continued)

*Primary Examiner* — Sonya M Sengupta
(74) *Attorney, Agent, or Firm* — Greenblum & Bernstein, P.L.C.

(57) ABSTRACT

A laminate that includes a semiconductor substrate; a support substrate that is light-transmissive; an adhesive layer; and a release layer provided between the semiconductor substrate and the support substrate, the laminate being used when the release layer absorbs light irradiated from a side of the support substrate and then the semiconductor substrate and the support substrate are separated from each other, wherein the release layer is formed from a release agent composition, the release agent composition contains a light-absorbing compound having a molecular weight of 2,000 or
(Continued)

less, and when the light-absorbing compound is measured for an absorption spectrum in a range of 250 to 800 nm, the absorption spectrum has a local maximum value, which is a maximum absorbance in a range of 250 to 800 nm, between 250 nm and 350 nm.

12 Claims, 1 Drawing Sheet

(51) Int. Cl.
*C09J 7/30* (2018.01)
*C09J 7/40* (2018.01)
*H10P 72/70* (2026.01)

(52) U.S. Cl.
CPC .......... *H10P 72/74* (2026.01); *B32B 2255/26* (2013.01); *B32B 2307/414* (2013.01); *B32B 2307/748* (2013.01); *B32B 2457/14* (2013.01); *C09J 2203/326* (2013.01); *C09J 2301/416* (2020.08); *C09J 2301/502* (2020.08)

(58) Field of Classification Search
CPC .......... B32B 2307/748; B32B 2457/14; B32B 43/006; B32B 7/023; B32B 7/06; B32B 7/12; C09J 2203/326; C09J 2301/416; C09J 2301/502; C09J 7/30; C09J 7/401; H01L 21/02; H01L 21/304; H01L 21/6835
See application file for complete search history.

(56) References Cited

U.S. PATENT DOCUMENTS

2014/0106473 A1 4/2014 Andry et al.
2014/0311680 A1* 10/2014 Kubo .................... B32B 7/06 428/522
2018/0233385 A1 8/2018 Iwata
2018/0233394 A1 8/2018 Burggraf et al.
2020/0353735 A1 11/2020 Ogino et al.
2025/0065601 A1* 2/2025 Okuno .................... B32B 7/06

FOREIGN PATENT DOCUMENTS

JP 2012-106486 A 6/2012
JP 2016-500918 A 1/2016
JP 2017-50322 A 3/2017
JP 2019-501790 A 1/2019
WO 2017/026279 A1 2/2017
WO 2019/088103 A1 5/2019

OTHER PUBLICATIONS

Translation of description of JP2017050322.*
International Search Report and Written Opinion of the International Searching Authority that issued in International Pat. Appl. No. PCT/JP2022/037649, dated Dec. 13, 2022, along with an English translation thereof.
Supplementary European search report that issued in corresponding European Application No. 22886654.7.
Office Action that issued in corresponding Taiwanese Application No. 111138772, dated Feb. 26, 2026, along with English translation thereof.
Office Action that issued in corresponding Japanese Application No. 2023-556270, dated Jun. 30, 2026, along with English translation thereof.
Office Action that issued in corresponding Korean Application 10-2024-7015866, dated Jun. 22, 2026, along with English translation thereof.

* cited by examiner

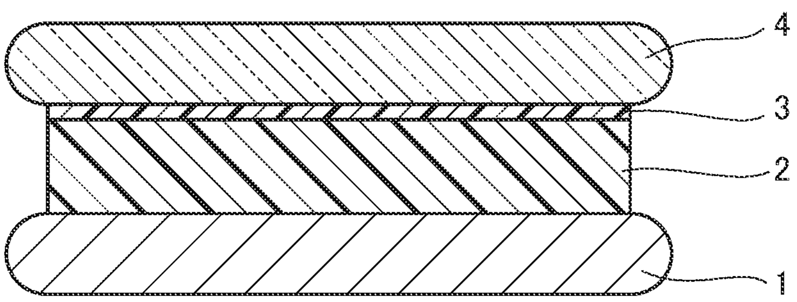
4
3
2
1

LAMINATE, RELEASE AGENT COMPOSITION, AND METHOD FOR PRODUCING PROCESSED SEMICONDUCTOR SUBSTRATE

TECHNICAL FIELD

The present invention relates to a laminate, a release agent composition, and a method for producing a processed semiconductor substrate.

BACKGROUND ART

Conventionally, semiconductor wafers have been integrated in a two-dimensional planar direction. For the purpose of further integration, a semiconductor integration technology in which the plane is further integrated (laminated) in a three-dimensional direction has been required. This three-dimensional lamination is a technique of integrating multiple layers while being connected with a through silicon via (TSV). At the time of integrating multiple layers, each wafer to be integrated is thinned by polishing on the side opposite to the formed circuit surface (that is, the back surface), and the thinned semiconductor wafers are laminated.

A semiconductor wafer before thinning (also referred to herein simply as a wafer) is bonded to a support for polishing with a polishing apparatus. The adhesion at this time is referred to as temporary adhesion because it must be easily released off after polishing. This temporary adhesion must be easily removed from the support. When a large force is applied to the removal, the thinned semiconductor wafer may be cut or deformed. The removal is easily performed such that the situation does not occur. However, at the time of polishing the back surface of a semiconductor wafer, it is not preferable that the semiconductor wafer is detached or displaced due to polishing stress. Therefore, the performance required for temporary adhesion is to withstand the stress during polishing and to be easily removed after polishing.

For example, there is a demand for a performance having a high stress (strong adhesive force) in the planar direction at the time of polishing and having a low stress (weak adhesive force) in the longitudinal direction at the time of removal.

Methods by laser irradiation have been disclosed for such adhesion and separation processes (see, for example, Patent Literatures 1 and 2). However, with further progress in the recent semiconductor field, new technologies related to releasing by irradiation of light such as a laser is always required.

CITATION LIST

Patent Literature

Patent Literature 1: JP 2004-64040 A
Patent Literature 2: JP 2012-106486 A

SUMMARY OF INVENTION

Technical Problem

An object of the present invention is to provide a laminate in which the support substrate and the semiconductor substrate can be easily separated from each other, and a residue of the release layer after light irradiation can be easily removed by a cleaning agent composition, a release agent composition that provides a film suitable as such a release layer, and a method for producing a processed semiconductor substrate using such a laminate.

Solution to Problem

As a result of intensive studies to solve the above problems, the present inventors have found that the above problems can be solved, and have completed the present invention having the following gist.

That is, the present invention includes the following.

[1]A laminate including:

a semiconductor substrate;

a support substrate that is light-transmissive; and an adhesive layer and a release layer provided between the semiconductor substrate and the support substrate, the laminate being used when the release layer absorbs light irradiated from a side of the support substrate and then the semiconductor substrate and the support substrate are separated from each other, wherein the release layer is formed from a release agent composition, the release agent composition contains a light-absorbing compound having a molecular weight of 2,000 or less, and when the light-absorbing compound is measured for an absorption spectrum in a range of 250 to 800 nm, the absorption spectrum has a local maximum value, which is a maximum absorbance in a range of 250 to 800 nm, between 250 nm and 350 nm.

[2] The laminate according to [1], wherein, when a film of the light-absorbing compound having a thickness of 200 nm is measured for a transmission spectrum, the transmission spectrum has a transmittance of 30% or less at a wavelength showing the local maximum value.

[3] The laminate according to [1] or [2], wherein the light-absorbing compound has an aromatic hydrocarbon ring having at least one of a hydroxy group and an alkoxy group.

[4] The laminate according to [3], wherein the light-absorbing compound has 4 or more and 10 or less of the aromatic hydrocarbon rings per molecular weight of 1,000.

[5] The laminate according to any one of [1] to [4], wherein the release agent composition contains the light-absorbing compound in an amount of 90 mass % or more with respect to a nonvolatile content in the release agent composition.

[6] The laminate according to any one of [1] to [5], wherein the adhesive layer is formed from an adhesive composition containing a compound having a siloxane structure.

[7] The laminate according to [6], wherein the adhesive composition contains a component (A), which is curable.

[8] The laminate according to [7], wherein the component (A) is cured through hydrosilylation reaction.

[9] The laminate according to [7] or [8], wherein the component (A) includes:

a polyorganosiloxane (a1) having an alkenyl group bonded to a silicon atom and having 2 to 40 carbon atoms;

a polyorganosiloxane (a2) having an Si—H group; and a platinum group metal-based catalyst (A2).

[10]A release agent composition that is, in a laminate including a semiconductor substrate; a support substrate; and an adhesive layer and a release layer provided between the semiconductor substrate and the support substrate, and used when the release layer absorbs light irradiated from a side of the support substrate and then the semiconductor substrate and the support substrate are separated from each other, used for forming the release layer, the release agent composition including: a light-absorbing compound having a molecular weight of 2,000 or less, wherein, when the light-absorbing compound is measured for an absorption spectrum in a range of 250 to 800 nm, the absorption spectrum has a local maximum value, which is a maximum absorbance in a range of 250 to 800 nm, between 250 nm and 350 nm.

[11] The release agent composition according to [10], wherein, when a film of the light-absorbing compound having a thickness of 200 nm is measured for a transmission spectrum, the transmission spectrum has a transmittance of 30% or less at a wavelength showing the local maximum value.

[12] The release agent composition according to [10] or [11], wherein the light-absorbing compound has an aromatic hydrocarbon ring having at least one of a hydroxy group and an alkoxy group.

[13] The release agent composition according to [12], wherein the light-absorbing compound has 4 or more and 10 or less of the aromatic hydrocarbon rings per molecular weight of 1,000.

[14] The release agent composition according to any one of [10] to [13], wherein the light-absorbing compound is contained in an amount of 90 mass % or more with respect to a nonvolatile content in the release agent composition.

[15]A method for producing a processed semiconductor substrate, the method including:

a first step of processing the semiconductor substrate of the laminate according to any one of [1] to [9]; and a second step of separating the semiconductor substrate, which has been processed in the first step, and the support substrate from each other.

[16] The method for producing a processed semiconductor substrate according to [15], wherein the second step includes a step of irradiating the release layer with light.

Advantageous Effects of Invention

According to the present invention, it is possible to provide a laminate in which the support substrate and the semiconductor substrate can be easily separated from each other, and a residue of the release layer after light irradiation can be easily removed by a cleaning agent composition, a release agent composition that provides a film suitable as such a release layer, and a method for producing a processed semiconductor substrate using such a laminate.

BRIEF DESCRIPTION OF DRAWING

FIG. 1 is a schematic cross-sectional view of an example of the laminate.

DESCRIPTION OF EMBODIMENTS (Laminate)

The laminate of the present invention includes a semiconductor substrate, a support substrate, an adhesive layer, and a release layer.

The support substrate is light-transmissive.

The adhesive layer and the release layer are provided between the semiconductor substrate and the support substrate.

The laminate is used for separating the semiconductor substrate and the support substrate after the release layer absorbs light irradiated from a side of the support substrate.

The release layer is formed from a release agent composition.

The release agent composition contains a light-absorbing compound having a molecular weight of 2,000 or less.

When the light-absorbing compound is measured for an absorption spectrum in a range of 250 to 800 nm, the absorption spectrum has a local maximum value (Hereinafter, it may be referred to as "highest local maximum value".), which is a maximum absorbance in a range of 250 to 800 nm, between 250 nm and 350 nm.

Hereinafter, the light-absorbing compound having the above characteristics may be referred to as "specific light-absorbing compound".

The laminate of the present invention can be suitably used for processing, such as thinning, a semiconductor substrate.

In the laminate of the present invention, the semiconductor substrate is supported on the support substrate via the adhesive layer and the release layer while the semiconductor substrate is subjected to processing such as thinning.

On the other hand, in the release layer formed from the release agent composition, the specific light-absorbing compound contained in the release agent composition absorbs light (for example, laser light) to alter (for example, separate or decompose) the release layer. As a result, after the release layer is irradiated with light, the semiconductor substrate and the support substrate are easily separated. Furthermore, after the semiconductor substrate and the support substrate are separated from each other, the residue of the release layer remaining on the semiconductor substrate or the support substrate can be easily removed by a cleaning agent composition for cleaning a semiconductor substrate.

The wavelength of light used for release is preferably a wavelength in the vicinity of a wavelength showing the highest local maximum value (250 to 350 nm) in the absorption spectrum of the specific light-absorbing compound. For example, a wavelength of 250 to 370 nm is suitable, and a wavelength of 308 nm, 343 nm, 355 nm, or 365 nm is more suitable. The light-irradiation amount required for releasing is an irradiation amount that can cause suitable deterioration, for example, decomposition of the specific light-absorbing compound.

The light used for releasing may be a laser light or a non-laser light emitted from a light source such as a lamp.

<Semiconductor Substrate>

The main material constituting the entire semiconductor substrate is not particularly limited as long as it is used for this type of application, and examples thereof include silicon, silicon carbide, and a compound semiconductor.

The shape of the semiconductor substrate is not particularly limited, and is, for example, a disk shape. Note that the disk-shaped semiconductor substrate does not need to have a completely circular surface. For example, the outer periphery of the semiconductor substrate may have a straight portion called an orientation flat or may have a cut called a notch.

The thickness of the disk-shaped semiconductor substrate may be appropriately determined according to the purpose of use of the semiconductor substrate and the like, and is not particularly limited, and is, for example, 500 to 1,000 μm.

The diameter of the disk-shaped semiconductor substrate may be appropriately determined according to the purpose of use of the semiconductor substrate and the like, and is not particularly limited, and is, for example, 100 to 1,000 mm.

The semiconductor substrate may have a bump. The bump is a protruding terminal.

In the laminate, when the semiconductor substrate has a bump, the semiconductor substrate has the bump on the support substrate side.

In the semiconductor substrate, the bump is usually formed on a surface on which a circuit is formed. The circuit may be a single layer or a multilayer. The shape of the circuit is not particularly limited.

In the semiconductor substrate, the surface opposite to the surface having a bump (back surface) is a surface to be processed.

The material, size, shape, structure, and density of the bump the semiconductor substrate has are not particularly limited.

Examples of the bump include a ball bump, a printed bump, a stud bump, and a plated bump.

Usually, the height, radius, and pitch of the bump are appropriately determined from the conditions of a bump height of about 1 to 200 μm, a bump radius of 1 to 200 μm, and a bump pitch of 1 to 500 μm.

Examples of the material of the bump include low-melting-point solder, high-melting-point solder, tin, indium, gold, silver, and copper. The bump may be composed only of a single component or may be composed of a plurality of components. More specific examples thereof include an alloy plating mainly containing Sn, such as SnAg bumps, SnBi bumps, Sn bumps, and AuSn bumps.

In addition, the bump may have a layered structure having a metal layer composed of at least one of these components.

An example of the semiconductor substrate is a silicon wafer having a diameter of about 300 mm and a thickness of about 770 μm.

<Support Substrate>

The support substrate is not particularly limited as long as it is a member that is light-transmissive to light irradiated to the release layer and can support the semiconductor substrate when the semiconductor substrate is processed, and examples thereof include a glass support substrate.

The shape of the support substrate is not particularly limited, and examples thereof include a disk shape.

The thickness of the disk-shaped support substrate may be appropriately determined according to the size of the semiconductor substrate and the like, and is not particularly limited, and is, for example, 500 to 1,000 μm.

The diameter of the disk-shaped support substrate may be appropriately determined according to the size of the semiconductor substrate and the like, and is not particularly limited, and is, for example, 100 to 1,000 mm.

An example of the support substrate is a glass wafer having a diameter of 300 mm and a thickness of about 700 μm.

<Release Layer>

The release layer is formed from a release agent composition.

The release layer is provided between the semiconductor substrate and the support substrate.

The release layer may be in contact with the support substrate or may be in contact with the semiconductor substrate.

The method for forming the release layer from the release agent composition is not particularly limited, and examples thereof include a forming method described later.

When the release layer is formed from the release agent composition, the specific light-absorbing compound may itself be crosslinked or react with other components to form a crosslinked structure, or may maintain its structure without crosslinking or reacting, as long as the effect of the present invention is obtained.

In other words, in the release layer, the specific light-absorbing compound may itself be crosslinked or react with other components to form a crosslinked structure, or may be present maintaining its structure.

<<Release Agent Composition>>

The release agent composition contains a specific light-absorbing compound.

The release agent composition may contain other components such as a solvent.

<<<Specific Light-Absorbing Compound>>>

The specific light-absorbing compound contained in the release agent composition has a molecular weight of 2,000 or less. The lower limit of the molecular weight of the compound is not particularly limited, but for example, the molecular weight of the compound is 400 or more.

When the specific light-absorbing compound is measured for an absorption spectrum in a range of 250 to 800 nm, the absorption spectrum has a local maximum value, which is a maximum absorbance in a range of 250 to 800 nm, between 250 nm and 350 nm. The absorption spectrum may have, for example, the highest local maximum value between 260 nm and 315 nm.

The specific light-absorbing compound has such light absorption characteristics, thereby achieving good separation property between the semiconductor substrate and the support substrate.

The absorption spectrum can be measured using a spectrophotometer (for example, an ultraviolet-visible near-infrared (UV-Vis-NIR) spectrophotometer).

The measurement range may be a broader range as long as the measurement range includes 250 to 800 nm.

In the measurement of the absorption spectrum, it is preferable to form a film having such a thickness that the presence of a local maximum value can be determined as a measurement sample. For example, the thickness of the film of the measurement sample is about 200 nm.

As for the light-absorptivity of the specific light-absorbing compound, when a film of the light-absorbing compound having a thickness of 200 nm is measured for a transmission spectrum, the transmission spectrum preferably has a transmittance of 30% or less at a wavelength showing the local maximum value. The lower limit value of the transmittance is not particularly limited, and may be 0%.

The specific light-absorbing compound preferably has an aromatic hydrocarbon ring having at least one of a hydroxy group and an alkoxy group. Examples of the alkoxy group include an alkoxy group having 1 to 6 carbon atoms.

Examples of the aromatic hydrocarbon ring include a benzene ring and a naphthalene ring.

The aromatic hydrocarbon ring having at least one of a hydroxy group and an alkoxy group may be a part of a polycyclic aromatic ring (for example, a part of a polycyclic aromatic hetero ring).

The aromatic hydrocarbon ring having at least one of a hydroxy group and an alkoxy group optionally has another substituent.

The specific light-absorbing compound preferably has 4 or more and 10 or less of the aromatic hydrocarbon rings having at least one of a hydroxy group and an alkoxy group per molecular weight of 1000, but is not limited thereto.

For example, as an example of the specific light-absorbing compound, carminic acid, having a molecular weight of 492.4 and shown below, has two aromatic hydrocarbon rings having at least one of a hydroxy group and an alkoxy group.

Therefore, the carminic acid has 4.1 (2×1,000/492.4) of the aromatic hydrocarbon rings having at least one of a hydroxy group and an alkoxy group per molecular weight of 1,000.

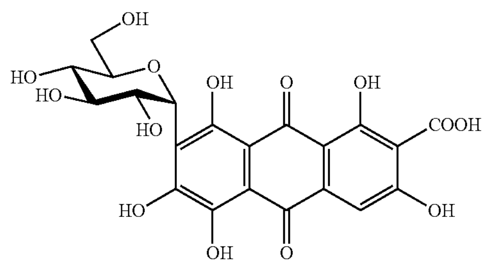

The content of the specific light-absorbing compound in the release agent composition is not particularly limited, but is preferably 90 mass % or more, and more preferably 95 mass % or more with respect to the nonvolatile content in the release agent composition.

The amount of the specific light-absorbing compound contained in the release agent composition varies depending on the coating method to be employed, the desired film thickness, and the like, and thus cannot be generally defined, but is usually 0.1 to 80 mass %, and from the viewpoint of reproducibly obtaining a laminate in which the semiconductor substrate and the support substrate can be satisfactorily separated, the amount is preferably 0.5 mass % or more, more preferably 1.0 mass % or more, still more preferably 5.0 mass % or more, and preferably 70 mass % or less, more preferably 60 mass % or less, still more preferably 50 mass % or less, still more preferably 40 mass % or less.

<<<Surfactant>>>

The release agent composition may contain a surfactant for the purpose of, for example, adjusting the liquid physical properties of the composition itself or the film physical properties of the resulting film, or reproducibly preparing a highly uniform release agent composition.

Examples of the surfactant include nonionic surfactants, such as: polyoxyethylene alkyl ethers, such as polyoxyethylene lauryl ether, polyoxyethylene stearyl ether, polyoxyethylene cetyl ether, and polyoxyethylene oleyl ether, polyoxyethylene alkyl allyl ethers, such as polyoxyethylene octyl phenol ether and polyoxyethylene nonyl phenol ether, polyoxyethylene/polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants, such as EFUTOP EF301, EF303, and EF352 (trade name, manufactured by TOKEM PRODUCTS), MEGAFACE F171, F173, R-30, and R-30N (trade name, manufactured by DIC Corporation), Fluorad FC430, FC431 (trade name, manufactured by Sumitomo 3M Limited), and AsahiGuard AG710, Surflon S-382, SC101, SC102, SC103, SC104, SC105, and SC106 (trade name, manufactured by Asahi Glass Co., Ltd.); and KP341, an organosiloxane polymer (manufactured by Shin-Etsu Chemical Co., Ltd.).

The surfactant can be used singly or in combination of two or more kinds thereof.

The amount of the surfactant is usually 2 mass % or less with respect to the film constituent components of the release agent composition. In the present invention, the term "film constituent components" means components other than a solvent contained in the composition.

<<<Solvent>>>

The release agent composition preferably contains a solvent.

As such a solvent, for example, a solvent capable of satisfactorily dissolving film constituent components such as the light-absorbing compound can be used. As necessary, two or more solvents may be used in combination for the purpose of adjusting viscosity, surface tension, and the like. Examples of the combination of two or more solvents include a combination of a highly polar solvent and a low polar solvent.

In the present invention, it is defined that the low polar solvent has a relative permittivity of less than 7 at a frequency of 100 kHz and the highly polar solvent has a relative permittivity of 7 or more at a frequency of 100 kHz. The solvent can be used singly or in combination of two or more kinds thereof.

Examples of the highly polar solvent include amide-based solvents, such as N,N-dimethylformamide, N,N-dimethylacetamide, N,N-dimethylisobutylamide, N-methylpyrrolidone, and 1,3-dimethyl-2-imidazolidinone; ketone-based solvents, such as ethyl methyl ketone, isophorone, and cyclohexanone; cyano-based solvents, such as acetonitrile and 3-methoxypropionitrile; polyhydric alcohol-based solvents, such as ethylene glycol, diethylene glycol, triethylene glycol, dipropylene glycol, 1,3-butanediol, and 2,3-butanediol; monohydric alcohol-based solvents other than aliphatic alcohols, such as propyleneglycol monomethylether, diethyleneglycol monomethylether, diethyleneglycol monophenylether, triethyleneglycol monomethylether, dipropyleneglycol monomethylether, benzyl alcohol, 2-phenoxyethanol, 2-benzyloxyethanol, 3-phenoxybenzyl alcohol, and tetrahydrofurfuryl alcohol; and sulfoxide-based solvents, such as dimethyl sulfoxide.

Examples of the low polar solvent include chlorine-based solvents, such as chloroform and chlorobenzene; aromatic hydrocarbon-based solvents, such as alkylbenzenes, such as toluene, xylene, tetralin, cyclohexylbenzene, and decylbenzene; aliphatic alcohol-based solvents, such as 1-octanol, 1-nonanol, and 1-decanol; ether-based solvents, such as tetrahydrofuran, dioxane, anisole, 4-methoxytoluene, 3-phenoxytoluene, dibenzyl ether, diethyleneglycol dimethylether, diethyleneglycol butylmethylether, triethyleneglycol dimethylether, and triethyleneglycol butylmethylether; ester-based solvents, such as methyl benzoate, ethyl benzoate, butyl benzoate, isoamyl benzoate, bis(2-ethylhexyl) phthalate, dibutyl maleate, dibutyl oxalate, hexyl acetate, propyleneglycol monomethylether acetate, diethyleneglycol monoethylether acetate, and diethyleneglycol monobutylether acetate.

The content of the solvent is appropriately determined in consideration of the desired viscosity of the composition, the coating method to be adopted, the thickness of the film to be prepared, and the like, and for example, is 99 mass % or less with respect to the entire composition, and preferably 70 to 99 mass % with respect to the entire composition. That is, the amount of the film constituent components in that case is 1 to 30 mass % with respect to the entire composition.

The viscosity and surface tension of the release agent composition are appropriately adjusted by changing the type of the solvent to be used, the ratio thereof, the concentration of the film constituent components, and the like in consideration of various factors such as the coating method to be used and the desired film thickness.

In an embodiment of the present invention, the release agent composition contains a glycol-based solvent from the viewpoint of reproducibly obtaining a highly uniform composition, from the viewpoint of reproducibly obtaining a composition with high storage stability, from the viewpoint of reproducibly obtaining a composition that provides a highly uniform film, and the like. The term "glycol-based solvent" as used herein is a generic term for glycols, glycol monoethers, glycol diethers, glycol monoesters, glycol diesters, and glycol ester ethers.

An example of a preferred glycol-based solvent is represented by the formula (G).

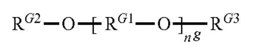

(G)

In the formula (G), $R^{G1}$ each independently represents a linear or branched alkylene group having 2 to 4 carbon atoms, $R^{G2}$ and $R^{G3}$ each independently represent a hydrogen atom, a linear or branched alkyl group having 1 to 8 carbon atoms, or an alkylacyl group in which the alkyl moiety is a linear or branched alkyl group having 1 to 8 carbon atoms, and $n^g$ is an integer of 1 to 6.

Specific examples of the linear or branched alkylene group having 2 to 4 carbon atoms include, but are not limited to, an ethylene group, a trimethylene group, a 1-methylethylene group, a tetramethylene group, a 2-methylpropane-1,3-diyl group, a pentamethylene group, and a hexamethylene group.

Among them, a linear or branched alkylene group having 2 to 3 carbon atoms is preferable, and a linear or branched alkylene group having three carbon atoms is more preferable from the viewpoint of reproducibly obtaining a highly uniform composition, from the viewpoint of reproducibly obtaining a composition with high storage stability, from the viewpoint of reproducibly obtaining a composition that provides a highly uniform film, and the like.

Specific examples of the linear or branched alkyl group having 1 to 8 carbon atoms include a methyl group, an ethyl group, a n-propyl group, an i-propyl group, a n-butyl group, an i-butyl group, a s-butyl group, a tertiary butyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a n-hexyl, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group, but are not limited thereto.

Among them, a methyl group and an ethyl group are preferable, and a methyl group is more preferable from the viewpoint of reproducibly obtaining a highly uniform composition, from the viewpoint of reproducibly obtaining a composition with high storage stability, from the viewpoint of reproducibly obtaining a composition that provides a highly uniform film, and the like.

Specific examples of the linear or branched alkyl group having 1 to 8 carbon atoms in the alkylacyl group in which the alkyl moiety is a linear or branched alkyl group having 1 to 8 carbon atoms include the same as the specific examples described above.

Among them, a methylcarbonyl group and an ethylcarbonyl group are preferable, and a methylcarbonyl group is more preferable from the viewpoint of reproducibly obtaining a highly uniform composition, from the viewpoint of reproducibly obtaining a composition with high storage stability, from the viewpoint of reproducibly obtaining a composition that provides a highly uniform film, and the like.

$n^g$ is preferably 4 or less, more preferably 3 or less, still more preferably 2 or less, and most preferably 1 from the viewpoint of reproducibly obtaining a highly uniform composition, from the viewpoint of reproducibly obtaining a composition with high storage stability, from the viewpoint of reproducibly obtaining a composition that provides a highly uniform film, and the like.

In the formula (G), preferably, at least one of $R^{G2}$ and $R^{G3}$ is a linear or branched alkyl group having 1 to 8 carbon atoms, more preferably, one of $R^{G2}$ and $R^{G3}$ is a linear or branched alkyl group having 1 to 8 carbon atoms, and the other is a hydrogen atom or an alkylacyl group in which the alkyl moiety is a linear or branched alkyl group having 1 to 8 carbon atoms, from the viewpoint of reproducibly obtaining a highly uniform composition, from the viewpoint of reproducibly obtaining a composition with high storage stability, from the viewpoint of reproducibly obtaining a composition that provides a highly uniform film, and the like.

The content of the glycol-based solvent is preferably 50 mass % or more, more preferably 70 mass % or more, still more preferably 80 mass % or more, still more preferably 90 mass % or more, and still more preferably 95 mass % or more, with respect to the solvent contained in the release agent composition, from the viewpoint of reproducibly obtaining a highly uniform composition, from the viewpoint of reproducibly obtaining a composition with high storage stability, from the viewpoint of reproducibly obtaining a composition that provides a highly uniform film, and the like.

In the release agent composition, the film constituent components are uniformly dispersed or dissolved in the solvent, and preferably dissolved, from the viewpoint of reproducibly obtaining a highly uniform composition, from the viewpoint of reproducibly obtaining a composition with high storage stability, from the viewpoint of reproducibly obtaining a composition that provides a highly uniform film, and the like.

The thickness of the release layer included in the laminate of the present invention is not particularly limited, but is usually 5 nm to 100 μm, 10 nm to 10 μm in one embodiment, 50 nm to 1 μm in another embodiment, and 100 nm to 700 nm in still another embodiment.

The release agent composition described above is also included in the present invention and the associated conditions (suitable conditions, manufacturing conditions, and the like) are as described above. By using the release agent composition of the present invention, for example, a film suitable as a release layer that can be used for manufacturing a semiconductor element can be manufactured with good reproducibility.

The release agent composition of the present invention can be suitably used, in a laminate including a semiconductor substrate, a support substrate, and an adhesive layer and a release layer provided between the semiconductor substrate and the support substrate, for forming the release layer. The laminate is used for separating the semiconductor substrate and the support substrate after the release layer absorbs light irradiated from a side of the support substrate.

One of the characteristics of the release layer obtained from the release agent composition of the present invention is that, after light irradiation is performed and then the semiconductor substrate and the support substrate are separated from each other, a residue of the release layer remaining on the semiconductor substrate or the support substrate can be suitably removed by a cleaning agent composition.

<<<Cleaning Agent Composition>>>

After light irradiation is performed and then the semiconductor substrate and the support substrate are separated from each other, a residue of the release layer remaining on the semiconductor substrate or the support substrate can be suitably removed by a cleaning agent composition. Such a cleaning agent composition usually contains a solvent.

Examples of the solvent include lactones, ketones, polyhydric alcohols, compounds having an ester bond, derivatives of polyhydric alcohols, cyclic ethers, esters, and aromatic organic solvents.

Examples of the lactones include γ-butyrolactone.

Examples of the ketones include acetone, methyl ethyl ketone, cyclohexanone, methyl-n-pentyl ketone, methyl isopentyl ketone, and 2-heptanone.

Examples of the polyhydric alcohols include ethylene glycol, diethylene glycol, propylene glycol, and dipropylene glycol.

Examples of the compounds having an ester bond include ethylene glycol monoacetate, diethylene glycol monoacetate, propylene glycol monoacetate, and dipropylene glycol monoacetate.

Examples of derivatives of polyhydric alcohols include a compound having an ether bond, such as monoalkyl ethers such as a monomethyl ether, a monoethyl ether, a monopropyl ether, and a monobutyl ether or a monophenyl ether of the polyhydric alcohols or the compounds having an ester bond. Among them, propylene glycol monomethyl ether acetate (PGMEA) and propylene glycol monomethyl ether (PGME) are preferable.

Examples of the cyclic ethers include dioxane.

Examples of the esters include methyl lactate, ethyl lactate (EL), methyl acetate, ethyl acetate, butyl acetate, methyl pyruvate, ethyl pyruvate, methyl methoxypropionate, and ethyl ethoxypropionate.

Examples of the aromatic organic solvents include anisole, ethyl benzyl ether, cresyl methyl ether, diphenyl ether, dibenzyl ether, phenetol, butyl phenyl ether, ethylbenzene, diethylbenzene, pentylbenzene, isopropylbenzene, toluene, xylene, cymene, and mesitylene.

These can be used singly or in combination of two or more kinds thereof.

Among them, propylene glycol monomethyl ether acetate (PGMEA), propylene glycol monomethyl ether (PGME), cyclohexanone, and ethyl lactate (EL) are preferable.

In addition, a mixed solvent obtained by mixing PGMEA and a polar solvent is also preferable. The mixing ratio (mass ratio) may be appropriately determined in consideration of compatibility between PGMEA and the polar solvent, and the like, and is preferably in the range of 1:9 to 9:1, more preferably 2:8 to 8:2.

For example, when EL is blended as the polar solvent, the mass ratio of PGMEA:EL is preferably 1:9 to 9:1, and more preferably 2:8 to 8:2. When PGME is blended as the polar solvent, the mass ratio of PGMEA:PGME is preferably 1:9 to 9:1, more preferably 2:8 to 8:2, and still more preferably 3:7 to 7:3. When PGME and cyclohexanone are blended as the polar solvent, the mass ratio of PGMEA:(PGME+cyclohexanone) is preferably 1:9 to 9:1, more preferably 2:8 to 8:2, and still more preferably 3:7 to 7:3.

The cleaning agent composition optionally contains a salt, but preferably does not contain a salt, from the viewpoint of enhancing versatility in processing a semiconductor substrate using the laminate and cost reduction.

An example of the cleaning agent composition containing a salt includes a cleaning agent composition containing a quaternary ammonium salt and a solvent.

The quaternary ammonium salt is composed of a quaternary ammonium cation and an anion, and is not particularly limited as long as it is used for this type of application.

Such quaternary ammonium cations typically include tetra(hydrocarbon)ammonium cations. On the other hand, the anion paired therewith includes a hydroxide ion ($OH^-$); halogen ions such as a fluorine ion ($F^-$), a chlorine ion ($Cl^-$), a bromine ion ($Br^-$), and an iodine ion ($I^-$); tetrafluoroborate ion ($BF_4^-$); hexafluorophosphate ion ($PF_6^-$); and the like, but is not limited thereto.

The quaternary ammonium salt is preferably a halogen-containing quaternary ammonium salt, and more preferably a fluorine-containing quaternary ammonium salt.

In the quaternary ammonium salt, the halogen atom may be contained in the cation or in the anion, and is preferably contained in the anion.

In a preferred embodiment, the fluorine-containing quaternary ammonium salt is a fluorinated tetra(hydrocarbon) ammonium.

Specific examples of the hydrocarbon group in the fluorinated tetra(hydrocarbon)ammonium include an alkyl group having 1 to 20 carbon atoms, an alkenyl group having 2 to 20 carbon atoms, an alkynyl group having 2 to 20 carbon atoms, and an aryl group having 6 to 20 carbon atoms.

In a more preferred embodiment, the fluorinated tetra (hydrocarbon)ammonium includes a fluorinated tetraalkylammonium.

Specific examples of the fluorinated tetraalkylammonium include, but are not limited to, fluorinated tetramethylammonium, fluorinated tetraethylammonium, fluorinated tetrapropylammonium, and fluorinated tetrabutylammonium (also referred to as tetrabutylammonium fluoride). Among them, fluorinated tetrabutylammonium is preferable.

As the quaternary ammonium salt such as a fluorinated tetra(hydrocarbon)ammonium, a hydrate may be used. The quaternary ammonium salt such as a fluorinated tetra(hydrocarbon)ammonium may be used singly or in combination of two or more kinds thereof.

The amount of the quaternary ammonium salt is not particularly limited as long as it dissolves in the solvent contained in the cleaning agent composition, and is usually 0.1 to 30 mass % with respect to the cleaning agent composition.

When the cleaning agent composition contains a salt, the solvent used in combination is not particularly limited as long as it is used for this type of use and dissolves salts such as the quaternary ammonium salt. From the viewpoint of reproducibly obtaining a cleaning agent composition having excellent detergency, from the viewpoint of obtaining a cleaning agent composition having excellent uniformity by favorably dissolving salts such as the quaternary ammonium salt, and the like, the cleaning agent composition preferably contains one or two or more amide-based solvents.

Suitable examples of the amide-based solvent include an acid amide derivative represented by the formula (Z).

(Z)

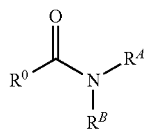

In the formula, $R^0$ represents an ethyl group, a propyl group, or an isopropyl group, and is preferably an ethyl group or an isopropyl group, more preferably an ethyl group. $R^A$ and $R^B$ each independently represent an alkyl group having 1 to 4 carbon atoms. The alkyl group having 1 to 4 carbon atoms may be linear, branched, or cyclic, and specific examples thereof include a methyl group, an ethyl group, a propyl group, an isopropyl group, a cyclopropyl group, a n-butyl group, an isobutyl group, an s-butyl group, a t-butyl group, and a cyclobutyl group. Among them, $R^A$ and $R^B$ are preferably a methyl group or an ethyl group, more preferably both a methyl group or an ethyl group, and still more preferably both a methyl group.

Examples of the acid amide derivative represented by the formula (Z) include N,N-dimethylpropionamide, N,N-diethylpropionamide, N-ethyl-N-methylpropionamide, N,N-dimethylbutyramide, N,N-diethylbutyramide, N-ethyl-N-methylbutyramide, N,N-dimethylisobutyramide, N,N-diethylisobutyramide, and N-ethyl-N-methylisobutyramide. Among them, N,N-dimethylpropionamide and N,N-dimethylisobutyramide are particularly preferable, and N,N-dimethylpropionamide is more preferable.

The acid amide derivative represented by the formula (Z) may be synthesized by a substitution reaction between the corresponding carboxylic acid ester and amine, or a commercially available product may be used.

Another example of the preferred amide-based solvent is a lactam compound represented by the formula (Y).

(Y)

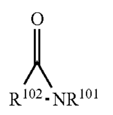

In the formula (Y), $R^{101}$ represents a hydrogen atom or an alkyl group having 1 to 6 carbon atoms, and $R^{102}$ represents an alkylene group having 1 to 6 carbon atoms. Specific examples of the alkyl group having 1 to 6 carbon atoms include a methyl group, an ethyl group, a n-propyl group, and a n-butyl group, and specific examples of the alkylene group having 1 to 6 carbon atoms include a methylene group, an ethylene group, a trimethylene group, a tetramethylene group, a pentamethylene group, and a hexamethylene group, but are not limited thereto.

Specific examples of the lactam compound represented by the formula (Y) include an α-lactam compound, a β-lactam compound, a γ-lactam compound, and a δ-lactam compound, and these compounds can be used alone or in combination of two or more thereof.

In a preferred embodiment of the present invention, the lactam compound represented by the formula (Y) contains 1-alkyl-2-pyrrolidone (N-alkyl-γ-butyrolactam), in a more preferred embodiment, N-methylpyrrolidone (NMP) or N-ethylpyrrolidone (NEP), and in a still more preferred embodiment, N-methylpyrrolidone (NMP).

Incidentally, the cleaning agent composition used in the present invention may contain water as a solvent, but usually, only an organic solvent is intentionally used as a solvent from the viewpoint of avoiding corrosion of the substrate and the like. In this case, it is not denied that hydration water of the salt or water contained in a trace amount in the organic solvent is contained in the cleaning agent composition. The cleaning agent composition used in the present invention usually contains water in an amount of 5 mass % or less.

<Adhesive Layer>

The adhesive layer is provided between the support substrate and the semiconductor substrate.

The adhesive layer is, for example, in contact with the semiconductor substrate. The adhesive layer may be in contact with the support substrate, for example.

The adhesive layer is not particularly limited, but is preferably formed from an adhesive composition.

<<Adhesive Composition>>

Examples of the adhesive composition include, but are not limited to, a polysiloxane-based adhesive agent, an acrylic resin-based adhesive agent, an epoxy resin-based adhesive agent, a polyamide-based adhesive agent, a polystyrene-based adhesive agent, a polyimide adhesive agent, and a phenol resin-based adhesive agent.

Among them, a polysiloxane-based adhesive agent is preferable as the adhesive composition because of: suitable adhesive ability exhibited during processing of a semiconductor substrate or the like; being able to suitably release after processing; further, excellent heat resistance; and being suitably removable with a cleaning agent composition.

The adhesive composition may be a thermosetting adhesive composition or a thermoplastic adhesive composition.

In a preferred embodiment, the adhesive composition contains a polyorganosiloxane.

In another preferred embodiment, the adhesive composition contains a component that cures by hydrosilylation reaction.

More specific embodiments of the thermosetting adhesive composition used in the present invention may include, for example, the following <<First Embodiment>> to <<Third Embodiment>>.

More specific embodiments of the thermoplastic adhesive composition used in the present invention may include, for example, <<Fourth Embodiment>>.

First Embodiment

As a preferred embodiment, the adhesive composition used in the present invention contains a polyorganosiloxane.

For example, the adhesive composition used in the present invention contains a component (A), which is curable, as an adhesive component. The adhesive composition used in the present invention may contain the component (A), which is curable, as an adhesive component, and a component (B), which causes no curing reaction. Here, examples of the component (B), which causes no curing reaction, include polyorganosiloxanes. In the present invention, the term "causes no curing reaction" does not mean not causing any curing reactions, but means not causing a curing reaction occurring in the component (A), which is curable.

In another preferred embodiment, the component (A) may be a component that is cured by hydrosilylation reaction, or may be a polyorganosiloxane component (A') that is cured by hydrosilylation reaction.

In another preferred embodiment, the component (A) includes, for example: a polyorganosiloxane (a1) having an alkenyl group bonded to a silicon atom and having 2 to 40 carbon atoms; a polyorganosiloxane (a2) having an Si—H group; and a platinum group metal-based catalyst (A2), as an example of the component (A'). Here, the alkenyl group having 2 to 40 carbon atoms may be substituted. Examples of the substituent include a halogen atom, a nitro group, a cyano group, an amino group, a hydroxy group, a carboxyl group, an aryl group, and a heteroaryl group.

In another preferred embodiment, the polyorganosiloxane component (A') that is cured by hydrosilylation reaction includes a polysiloxane (A1) containing one or two or more units selected from the group consisting of a siloxane unit (Q unit) represented by $SiO_2$, a siloxane unit (M unit) represented by $R^1R^2R^3SiO_{1/2}$, a siloxane unit (D unit) represented by $R^4R^5SiO_{2/2}$, and a siloxane unit (T unit) represented by $R^6SiO_{3/2}$, and a platinum group metal-based catalyst (A2). The polysiloxane (A1) includes: a polyorganosiloxane (a1') containing one or two or more units selected from the group consisting of a siloxane unit (Q' unit) represented by $SiO_2$, a siloxane unit (M' unit) represented by $R^{1'}R^{2'}R^{3'}SiO_{1/2}$, a siloxane unit (D' unit) represented by $R^{4'}R^{5'}SiO_{2/2}$, and a siloxane unit (T' unit) represented by $R^{6'}SiO_{3/2}$, and also containing at least one selected from the group consisting of the M' unit, the D' unit, and the T' unit; and a polyorganosiloxane (a2') containing one or two or more units selected from the group consisting of a siloxane unit (Q" unit) represented by $SiO_2$, a siloxane unit (M" unit) represented by $R^{1''}R^{2''}R^{3''}SiO_{1/2}$, a siloxane unit (D" unit) represented by $R^{4''}R^{5''}SiO_{2/2}$, and a siloxane unit (T" unit) represented by $R^{6''}SiO_{3/2}$, and also containing at least one selected from the group consisting of the M" unit, the D" unit, and the T" unit.

Note that (a1') is an example of (a1), and (a2') is an example of (a2).

$R^1$ to $R^6$ are groups or atoms bonded to a silicon atom, and each independently represent an optionally substituted alkyl group, an optionally substituted alkenyl group, or a hydrogen atom. Examples of the substituent include a halogen atom, a nitro group, a cyano group, an amino group, a hydroxy group, a carboxyl group, an aryl group, and a heteroaryl group.

$R^{1'}$ to $R^{6'}$ are groups bonded to a silicon atom and each independently represent an optionally substituted alkyl group or an optionally substituted alkenyl group, and at least one of $R^{1'}$ to $R^{6'}$ is an optionally substituted alkenyl group. Examples of the substituent include a halogen atom, a nitro group, a cyano group, an amino group, a hydroxy group, a carboxyl group, an aryl group, and a heteroaryl group.

$R^{1''}$ to $R^{6''}$ are groups or atoms bonded to a silicon atom and each independently represent an optionally substituted alkyl group or a hydrogen atom, and at least one of $R^{1''}$ to $R^{6''}$ is a hydrogen atom. Examples of the substituent include a halogen atom, a nitro group, a cyano group, an amino group, a hydroxy group, a carboxyl group, an aryl group, and a heteroaryl group.

The alkyl group may be linear, branched, or cyclic, and is preferably a linear or branched alkyl group. The number of carbon atoms thereof is not particularly limited, and is usually 1 to 40, preferably 30 or less, more preferably 20 or less, and still more preferably 10 or less.

Specific examples of the linear or branched and optionally substituted alkyl group include a methyl group, an ethyl group, a n-propyl group, an i-propyl group, a n-butyl group, an i-butyl group, a s-butyl group, a tertiary butyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group, but are not limited thereto. The number of carbon atoms thereof is usually 1 to 14, preferably 1 to 10, and more preferably 1 to 6. Among them, a methyl group is particularly preferable.

Specific examples of the cyclic and optionally substituted alkyl group include: cycloalkyl groups, such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group; and bicycloalkyl groups, such as a bicyclobutyl group, a bicyclopentyl group, a bicyclohexyl group, a bicycloheptyl group, a bicyclooctyl group, a bicyclononyl group, and a bicyclodecyl group, but are not limited thereto. The number of carbon atoms thereof is usually 3 to 14, preferably 4 to 10, and more preferably 5 to 6.

The alkenyl group may be linear or branched, and the number of carbon atoms thereof is not particularly limited, and is usually 2 to 40, and is preferably 30 or less, more preferably 20 or less, and still more preferably 10 or less.

Specific examples of the linear or branched and optionally substituted alkenyl group include a vinyl group, an allyl group, a butenyl group, and a pentenyl group, and are not limited thereto. The number of carbon atoms thereof is usually 2 to 14, preferably 2 to 10, and more preferably 1 to 6. Among them, an ethenyl group and a 2-propenyl group are particularly preferable.

Specific examples of the cyclic and optionally substituted alkenyl group include, but are not limited to, cyclopentenyl and cyclohexenyl. The number of carbon atoms thereof is usually 4 to 14, preferably 5 to 10, and more preferably 5 to 6.

As described above, the polysiloxane (A1) contains the polyorganosiloxane (a1') and the polyorganosiloxane (a2'), and an alkenyl group contained in the polyorganosiloxane (a1') and a hydrogen atom (Si—H group) contained in the polyorganosiloxane (a2') form a crosslinked structure through hydrosilylation reaction by the platinum group metal-based catalyst (A2) to be cured. As a result, a cured film is formed.

The polyorganosiloxane (a1') contains one or two or more units selected from the group consisting of the Q' unit, the M' unit, the D' unit, and the T' unit, and also contains at least one selected from the group consisting of the M' unit, the D' unit, and the T' unit. As the polyorganosiloxane (a1'), two or more polyorganosiloxanes satisfying such conditions may be used in combination.

Preferred combinations of two or more selected from the group consisting of the Q' unit, the M' unit, the D' unit, and the T' unit include, but are not limited to, (the Q' unit and the M' unit), (the D' unit and the M' unit), (the T' unit and the M' unit), and (the Q' unit, the T' unit, and the M' unit).

When the polyorganosiloxane (a1') contains two or more polyorganosiloxanes, a combination of (the Q' unit and the M' unit) and (the D' unit and the M' unit), a combination of (the T' unit and the M' unit) and (the D' unit and the M' unit), and a combination of (the Q' unit, the T' unit, and the M' unit) and (the T' unit and the M' unit) are preferable, but the combination is not limited thereto.

The polyorganosiloxane (a2') contains one or two or more units selected from the group consisting of the Q" unit, the M" unit, the D" unit, and the T" unit, and also contains at least one selected from the group consisting of the M" unit, the D" unit, and the T" unit. As the polyorganosiloxane (a2'), two or more polyorganosiloxanes satisfying such conditions may be used in combination.

Preferred combinations of two or more selected from the group consisting of the Q" unit, the M" unit, the D" unit, and the T" unit include, but are not limited to, (the M" unit and the D" unit), (the Q" unit and the M" unit), and (the Q" unit, the T" unit, and the M" unit).

The polyorganosiloxane (a1') is composed of siloxane units in which alkyl groups and/or alkenyl groups are bonded to silicon atoms thereof, and the proportion of alkenyl groups in the total substituents represented by $R^{1'}$ to $R^{6'}$ is preferably 0.1 to 50.0 mol % and more preferably 0.5 to 30.0 mol %, and the remaining $R^{1'}$ to $R^{6'}$ may be alkyl groups.

The polyorganosiloxane (a2') is composed of siloxane units in which alkyl groups and/or hydrogen atoms are bonded to silicon atoms thereof, and the proportion of hydrogen atoms in the total substituent groups and substituent atoms represented by $R^{1''}$ to $R^{6''}$ is preferably 0.1 to 50.0 mol % and more preferably 10.0 to 40.0 mol %, and the remaining $R^{1''}$ to $R^{6''}$ may be alkyl groups.

When the component (A) contains (a1) and (a2), in a preferred embodiment of the present invention, the molar ratio of the alkenyl group contained in the polyorganosiloxane (a1) and the hydrogen atom constituting the Si—H bond contained in the polyorganosiloxane (a2) is in a range of 1.0: 0.5 to 1.0: 0.66.

The weight average molecular weight of the polysiloxanes such as the polyorganosiloxane (a1) and the polyorganosiloxane (a2) is not particularly limited, and is usually 500 to 1,000,000, and is preferably 5,000 to 50,000 from the viewpoint of reproducibly realizing the effects of the present invention.

In the present invention, the weight average molecular weight, the number average molecular weight, and the dispersity of the polyorganosiloxanes (excluding the organosiloxane polymer) can be measured, for example, using a GPC apparatus (EcoSEC, HLC-8320GPC; manufactured by Tosoh Corporation) and a GPC column (TSKgel SuperMultiporeHZ-N and TSKgel SuperMultiporeHZ-H; manufactured by Tosoh Corporation), at a column temperature of 40° C., using tetrahydrofuran as an eluent (elution solvent), at a flow amount (flow rate) of 0.35 mL/min, and using polystyrene (Shodex from Showa Denko K.K.) as a standard sample.

The viscosity of each of the polyorganosiloxane (a1) and the polyorganosiloxane (a2) is not particularly limited, but is usually 10 to 1000000 (mPa·s), and is preferably 50 to 10000 (mPa·s) from the viewpoint of reproducibly realizing the effects of the present invention. The viscosity of each of the polyorganosiloxane (a1) and the polyorganosiloxane (a2) is a value measured with an E-type rotational viscometer at 25° C.

The polyorganosiloxane (a1) and the polyorganosiloxane (a2) react with each other through hydrosilylation reaction to form a film. Therefore, the curing mechanism is different from that via, for example, silanol groups. Therefore, either siloxane does not need to contain a silanol group or a functional group that forms a silanol group through hydrolysis, such as an alkyloxy group.

In a preferred embodiment of the present invention, the adhesive composition contains a platinum group metal-based catalyst (A2) together with the polyorganosiloxane component (A').

Such a platinum-based metal catalyst is a catalyst to promote hydrosilylation reaction between the alkenyl group of the polyorganosiloxane (a1) and the Si—H group of the polyorganosiloxane (a2).

Specific examples of the platinum-based metal catalyst include platinum-based catalysts such as platinum black, platinum (II) chloride, chloroplatinic acid, a reaction product of chloroplatinic acid and a monohydric alcohol, a complex of chloroplatinic acid and olefins, and platinum bisacetoacetate, but are not limited thereto.

Examples of the complex of platinum and olefins include, but are not limited to, a complex of divinyltetramethyldisiloxane and platinum.

The amount of the platinum group metal-based catalyst (A2) is not particularly limited, but is usually in a range of 1.0 to 50.0 ppm with respect to the total amount of the polyorganosiloxane (a1) and the polyorganosiloxane (a2).

The polyorganosiloxane component (A') may contain a polymerization inhibitor (A3) for the purpose of suppressing the progress of hydrosilylation reaction.

The polymerization inhibitor is not particularly limited as long as it can suppress the progress of hydrosilylation reaction, and specific examples thereof include alkynyl alcohols such as 1-ethynyl-1-cyclohexanol and 1,1-diphenyl-2-propion-1-ol.

The amount of the polymerization inhibitor is not particularly limited, and is usually 1000.0 ppm or more with respect to the total amount of the polyorganosiloxane (a1) and the polyorganosiloxane (a2) from the viewpoint of obtaining the effect, and is 10000.0 ppm or less from the viewpoint of preventing excessive suppression of hydrosilylation reaction.

An example of the adhesive composition used in the present invention may contain a component (B), which causes no curing reaction, as a release agent component in addition to the component (A), which is curable. By containing such a component (B) in the adhesive composition, the resulting adhesive layer can be suitably released with good reproducibility.

Typical examples of the component (B) include noncurable polyorganosiloxanes, and specific examples thereof include epoxy group-containing polyorganosiloxanes, methyl group-containing polyorganosiloxanes, and phenyl group-containing polyorganosiloxanes, but are not limited thereto.

Examples of the component (B) include polydimethylsiloxane. The polydimethylsiloxane may be modified. Examples of the optionally modified polydimethylsiloxane include, but are not limited to, an epoxy group-containing polydimethylsiloxane, an unmodified polydimethylsiloxane, and a phenyl group-containing polydimethylsiloxane.

Preferred examples of the polyorganosiloxane as the component (B) include epoxy group-containing polyorganosiloxanes, methyl group-containing polyorganosiloxanes, and phenyl group-containing polyorganosiloxanes, but are not limited thereto.

The weight average molecular weight of the polyorganosiloxane as the component (B) is not particularly limited, but is usually 100,000 to 2,000,000, and is preferably 200,000 to 1,200,000, and more preferably 300,000 to 900,000 from the viewpoint of reproducibly realizing the effect of the present invention. In addition, the dispersity is not particularly limited, but is usually 1.0 to 10.0, and is preferably 1.5 to 5.0, and more preferably 2.0 to 3.0 from the viewpoint of reproducibly realizing suitable releasing. The weight average molecular weight and the dispersity can be measured by the above-described method relating to the polyorganosiloxane.

The viscosity of the polyorganosiloxane as the component (B) is not particularly limited, but is usually 1,000 to 2,000,000 $mm^2/s$. The value of the viscosity of the polyorganosiloxane as the component (B) is expressed by kinematic viscosity, and centistokes (cSt)=$mm^2/s$. The value can also be determined by dividing the viscosity (mPa·s) by the density ($g/cm^3$). That is, the value can be determined from the viscosity measured with an E-type rotational viscometer measured at 25° C. and the density, and can be calculated from the equation: kinematic viscosity ($mm^2/s$)=viscosity (mPa·s)/density ($g/cm^3$).

Examples of the epoxy group-containing polyorganosiloxane include those containing a siloxane unit ($D^{10}$ unit) represented by $R^{11}R^{12}SiO^{2/2}$.

$R^{11}$ is a group bonded to a silicon atom and represents an alkyl group. $R^{12}$ is a group bonded to a silicon atom and represents an epoxy group or an organic group containing an epoxy group. Specific examples of the alkyl group can include the above-described examples.

The epoxy group in the organic group containing an epoxy group may be an independent epoxy group that is not fused with other rings, or may be an epoxy group forming a fused ring with other rings, such as a 1,2-epoxycyclohexyl group.

Specific examples of the organic group containing an epoxy group include, but are not limited to, 3-glycidoxypropyl and 2-(3,4-epoxycyclohexyl)ethyl.

In the present invention, preferred examples of the epoxy group-containing polyorganosiloxane include, but are not limited to, an epoxy group-containing polydimethylsiloxane.

The epoxy group-containing polyorganosiloxane contains the above-described siloxane unit ($D^{10}$ unit), and may contain the Q unit, the M unit, and/or the T unit in addition to the $D^{10}$ unit.

In a preferred embodiment of the present invention, specific examples of the epoxy group-containing polyorganosiloxane include a polyorganosiloxane composed only of the $D^{10}$ unit, a polyorganosiloxane containing the $D^{10}$ unit and the Q unit, a polyorganosiloxane containing the $D^{10}$ unit and the M unit, a polyorganosiloxane containing the $D^{10}$ unit and the T unit, a polyorganosiloxane containing the $D^{10}$ unit, the Q unit, and the M unit, a polyorganosiloxane containing the $D^{10}$ unit, the M unit, and the T unit, and a polyorganosiloxane containing the $D^{10}$ unit, the Q unit, the M unit, and the T unit.

The epoxy group-containing polyorganosiloxane is preferably an epoxy group-containing polydimethylsiloxane having an epoxy value of 0.1 to 5. The weight average molecular weight thereof is not particularly limited, and is usually 1,500 to 500,000, and is preferably 100,000 or less from the viewpoint of suppressing precipitation in the composition.

Specific examples of the epoxy group-containing polyorganosiloxane include, but are not limited to, those represented by the formulae (E1) to (E3).

(E1)

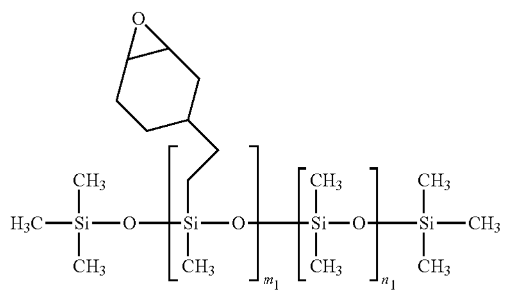

($m_1$ and $n_1$ represent the number of each repeating unit, and are positive integers.)

(E2)

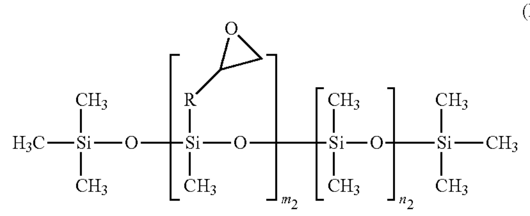

($m_2$ and $n_2$ represent the number of each repeating unit and are positive integers, and R is an alkylene group having 1 to 10 carbon atoms.)

(E3)

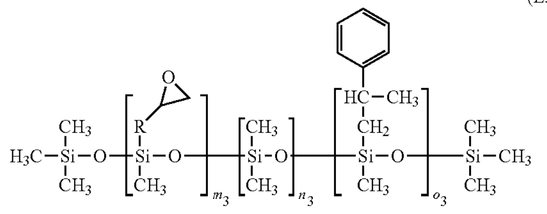

($m_3$, $n_3$, and $o_3$ represent the number of each repeating unit, and are positive integers, and R is an alkylene group having 1 to 10 carbon atoms.)

Examples of the methyl group-containing polyorganosiloxane include those containing a siloxane unit ($D^{200}$ unit) represented by $R^{210}R^{220}SiO_{2/2}$, and preferably those containing a siloxane unit ($D^{20}$ unit) represented by $R^{21}R^{21}SiO_{2/2}$.

$R^{210}$ and $R^{220}$ are groups bonded to a silicon atom, and each independently represent an alkyl group, and at least one thereof is a methyl group, and specific examples of the alkyl group include the above-described examples.

$R^{21}$ is a group bonded to a silicon atom and represents an alkyl group, and specific examples of the alkyl group can include the above examples. Among them, $R^{21}$ is preferably a methyl group.

In the present invention, preferred examples of the methyl group-containing polyorganosiloxane include, but are not limited to, polydimethylsiloxane.

The methyl group-containing polyorganosiloxane contains the above-described siloxane units (the $D^{200}$ unit or the $D^{20}$ unit), and may contain the Q unit, the M unit, and/or the T unit in addition to the $D^{200}$ unit and the $D^{20}$ unit.

In an embodiment of the present invention, specific examples of the methyl group-containing polyorganosiloxane include a polyorganosiloxane composed only of the $D^{200}$ unit, a polyorganosiloxane containing the $D^{200}$ unit and the Q unit, a polyorganosiloxane containing the $D^{200}$ unit and the M unit, a polyorganosiloxane containing the $D^{200}$ unit and the T unit, a polyorganosiloxane containing the $D^{200}$ unit, the Q unit, and the M unit, a polyorganosiloxane containing the $D^{200}$ unit, the M unit, and the T unit, and a polyorganosiloxane containing the $D^{200}$ unit, the Q unit, the M unit, and the T unit.

In a preferred embodiment of the present invention, specific examples of the methyl group-containing polyorganosiloxane include a polyorganosiloxane composed only of the $D^{20}$ unit, a polyorganosiloxane containing the $D^{20}$ unit and the Q unit, a polyorganosiloxane containing the $D^{20}$ unit and the M unit, a polyorganosiloxane containing the $D^{20}$ unit and the T unit, a polyorganosiloxane containing the $D^{20}$ unit, the Q unit, and the M unit, a polyorganosiloxane containing the $D^{20}$ unit, the M unit, and the T unit, and a polyorganosiloxane containing the $D^{20}$ unit, the Q unit, the M unit, and the T unit.

Specific examples of the methyl group-containing polyorganosiloxane include, but are not limited to, those represented by the formula (M1).

(M1)

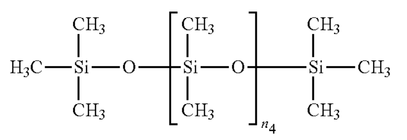

($n_4$ represents the number of repeating units, and is a positive integer.)

Examples of the phenyl group-containing polyorganosiloxane include those containing a siloxane unit ($D^{30}$ unit) represented by $R^{31}R^{32}SiO_{2/2}$.

$R^{31}$ is a group bonded to a silicon atom and represents a phenyl group or an alkyl group. $R^{32}$ is a group bonded to a silicon atom and represents a phenyl group. Specific examples of the alkyl group include the above-described examples, and a methyl group is preferable.

The phenyl group-containing polyorganosiloxane contains the above-described siloxane unit ($D^{30}$ unit), and may contain the Q unit, the M unit, and/or the T unit in addition to the $D^{30}$ unit.

In a preferred embodiment of the present invention, specific examples of the phenyl group-containing polyorganosiloxane include a polyorganosiloxane composed only of the $D^{30}$ unit, a polyorganosiloxane containing the $D^{30}$ unit and the Q unit, a polyorganosiloxane containing the $D^{30}$ unit and the M unit, a polyorganosiloxane containing the $D^{30}$ unit and the T unit, a polyorganosiloxane containing the $D^{30}$ unit, the Q unit, and the M unit, a polyorganosiloxane containing the $D^{30}$ unit, the M unit, and the T unit, and a polyorganosiloxane containing the $D^{30}$ unit, the Q unit, the M unit, and the T unit.

Specific examples of the phenyl group-containing polyorganosiloxane include, but are not limited to, those represented by the formula (P1) or (P2).

(P1)

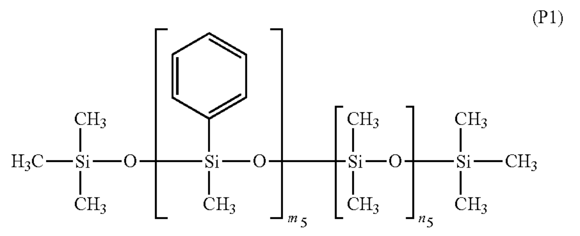

($m_5$ and $n_5$ represent the number of each repeating unit, and are positive integers.)

(P2)

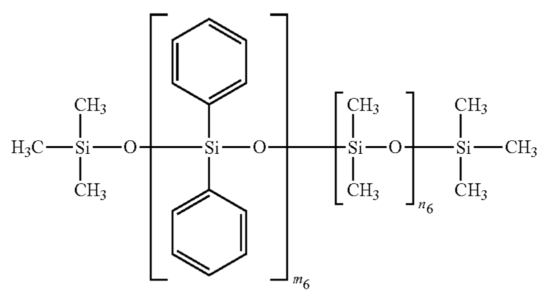

($m_6$ and $n_6$ represent the number of each repeating unit, and are positive integers.)

The polyorganosiloxane as the release agent component (B) may be a commercially available product or a synthetic product.

Examples of commercially available products of the polyorganosiloxane include WACKERSILICONE FLUID AK series (AK50, AK 350, AK 1000, AK 10000, AK 1000000) and GENIOPLAST GUM, which are products manufactured by Wacker Chemie AG, dimethyl silicone oils (KF-96L, KF-96A, KF-96, KF-96H, KF-69, KF-965, KF-968) and a cyclic dimethyl silicone oil (KF-995), which are manufactured by Shin-Etsu Chemical Co., Ltd.; epoxy group-containing polyorganosiloxanes (trade name: CMS-227, ECMS-327), which are manufactured by Gelest, Inc., epoxy group-containing polyorganosiloxanes manufactured by Shin-Etsu Chemical Co., Ltd. (KF-101, KF-1001, KF-1005, X-22-343), an epoxy group-containing polyorganosiloxane manufactured by Dow Corning Corp. (BY16-839); phenyl group-containing polyorganosiloxanes manufactured by Gelest, Inc. (PMM-1043, PMM-1025, PDM-0421, PDM-0821), a phenyl group-containing polyorganosiloxane manufactured by Shin-Etsu Chemical Co., Ltd. (KF50-3000CS), phenyl group-containing polyorganosiloxanes manufactured by MOMENTIVE (TSF431, TSF433), and the like, but are not limited thereto.

In one embodiment, the adhesive composition used in the present invention contains a component (B), which causes no curing reaction, together with the component (A), which is curable. In another embodiment, a polyorganosiloxane is contained as the component (B).

The adhesive composition of the present invention, as an example, can contain the component (A) and the component (B) in any ratio. In consideration of the balance of adhesion and releasing property, the ratio of the component (A) to the component (B) is, in terms of mass ratio [(A) (B)], preferably 99.995:0.005 to 30:70, and more preferably 99.9:0.1 to 75:25.

That is, when the polyorganosiloxane component (A'), which is cured through hydrosilylation reaction, is contained, the ratio of the component (A') to the component (B) is, in terms of mass ratio [(A'):(B)], preferably 99.995:0.005 to 30:70, and more preferably 99.9:0.1 to 75:25.

The viscosity of the adhesive composition used in the present invention is not particularly limited, but is usually 500 to 20,000 mPa·s, and preferably 1,000 to 1,0000 mPa·s at 25° C.

Second Embodiment

As a preferred embodiment, the adhesive composition used in the present invention contains, for example, a curable adhesive material described below, or the curable adhesive material and a release additive.

The curable adhesive material is selected from, for example, polyarylene oligomers, cyclic olefin oligomers, aryl cyclobutene oligomers, vinyl aromatic oligomers, and mixtures thereof.

Examples of the release additive include a polyether compound.

The polyether compound preferably contains a terminal group selected from the group consisting of hydroxy, alkoxy, aryloxy, and mixtures thereof.

The polyether compound is preferably selected from polyethylene glycol, polypropylene glycol, poly(1,3-propanediol), polybutylene glycol, poly(tetrahydrofuran), ethylene glycol-propylene glycol copolymers, and mixtures thereof.

The release additive is preferably selected from the group consisting of polyalkylene oxide homopolymers and polyalkylene oxide copolymers.

As the adhesive composition of the second embodiment, for example, the temporary bonding composition described in JP 2014-150239 A can be used.

The adhesive composition of the second embodiment will be described in more detail below.

The adhesive composition used in the present invention contains the curable adhesive material and the release additive. Typically, the curable adhesive material has a modulus of >1 GPa when cured. Exemplary curable adhesive materials include, but are not limited to, polyarylene oligomers, cyclic olefin oligomers, aryl cyclobutene oligomers, vinyl aromatic oligomers, and mixtures thereof. The curable adhesive material may be substituted with some suitable moiety to provide additional hydrophobicity, such as a fluorine-containing group, but only if such a moiety does not adversely affect the mechanical properties of the cured adhesive material. Preferably, the curable adhesive material is selected from polyarylene oligomers, cyclic olefin oligomers, aryl cyclobutene oligomers, vinyl aromatic oligomers, and mixtures thereof, more preferably from one or more of aryl cyclobutene oligomers, vinyl aromatic oligomers, and mixtures thereof. When a mixture of different curable adhesive materials is used in the present invention, such materials are selected to cure each other during the curing process. When a mixture of different curable materials is used, these curable materials are used in a mass ratio of 99:1 to 1:99, preferably 95: 5 to 5: 95, more preferably 90: 10 to 10: 90, even more preferably 75: 25 to 25: 75.

A wide variety of polyarylene oligomers may be used in the present invention. As used herein, the term "polyarylene" includes polyarylene ethers. Suitable polyarylene oligomers may be synthesized from precursors such as an ethynyl aromatic compound of the following formula:

(I)

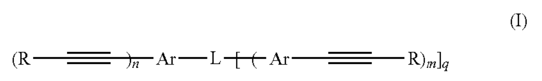

wherein each Ar is an aromatic group or an inertly substituted aromatic group; each R is independently hydrogen, alkyl, aryl, or an inertly substituted alkyl or aryl group; L is a covalent bond or a group linking one Ar to at least one other Ar; n and m are integers of at least 2; and q is an integer of at least 1. As such, the ethynyl aromatic compound usually has four or more ethynyl groups (for example, a tetraethynyl aromatic compound).

Suitable polyarylene oligomers for use in the temporary bonding composition as the adhesive composition of the second embodiment may contain a polymer having the following as a polymerization unit:

(II)

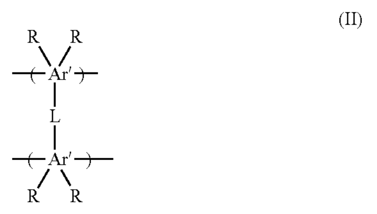

wherein Ar' is a residue of the (C≡C)n-Ar or Ar—(C≡C)m moiety of the reaction product, and R, L, n, and m are as defined above. Polyarylene copolymers useful in the present invention include monomers having the following formula as polymerization units:

(III)

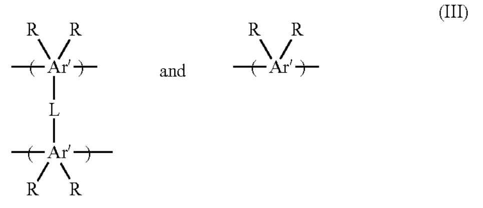

wherein Ar' and R are as defined above.

Exemplary polyarylenes include ones whose Ar-L-Ar is: biphenyl; 2,2-diphenylpropane; 9,9'-diphenylfluorene; 2,2-diphenylhexafluoropropane; diphenyl sulfide; oxydiphenylene; diphenyl ether; bis(phenylene)diphenylsilane; bis (phenylene)phosphine oxide; bis(phenylene)benzene; bis (phenylene)naphthalene; bis(phenylene)anthracene; thiodiphenylene; 1,1,1-triphenylene ethane; 1,3,5-triphenylenebenzene; 1,3,5-(2-phenylene-2-propyl)benzene; 1,1,1-triphenylene methane; 1,1,2,2-tetraphenylene-1,2-diphenylethane; bis(1,1-diphenyleneethyl)benzene; 2,2'-diphenylene-1,1,1,3,3,3-hexafluoropropane; 1,1-diphenylene-1-phenylethane; naphthalene; anthracene; or bis(phenylene)naphthacene; more preferably, biphenylene;

naphthylene; p,p'-(2,2-diphenylenepropane) (or $C_6H_4$—C$(CH_3)_2$—$C_6H_4$—); p, p'-(2, 2-diphenylene-1,1,1,3,3,3 hexafluoropropene), and (—$C_6H_4$—$C(CF_3)_2$—$C_6H_4$—), but are not limited thereto. Useful bisphenyl derivatives include 2,2-diphenylpropane; 9,9'-diphenylfluorene; 2,2-diphenylhexafluoropropane; diphenyl sulfide; diphenyl ether; bis(phenylene)diphenylsilane; bis(phenylene)phosphine oxide; bis(phenylene)benzene; bis(phenylene)naphthalene; bis(phenylene)anthracene; and bis(phenylene)naphthacene.

The polyarylene precursor monomer may be prepared by various methods known in the art, for example: (a) selectively halogenating, preferably brominating, a polyphenol (preferably a bisphenol) in a solvent (wherein each phenolic ring is halogenated with one halogen at one of the two positions that are ortho to the phenolic hydroxyl group); (b) converting the phenolic hydroxyl on the resulting poly(ortho-halophenol) to a leaving group, such as a sulfonate ester, which is reactive with and substituted by a terminal ethynyl compound, preferably in a solvent (for example, trifluoromethanesulfonate ester prepared from trifluoromethanesulfonyl halide or trifluoromethanesulfonic anhydride); and (c) reacting the reaction product of the step (b) with an ethynyl-containing compound or ethynyl synthone, in the presence of an arylethynylation catalyst, preferably a palladium catalyst, and an acid acceptor, to simultaneously replace the halogen and the trifluoromethyl sulfonate with an ethynyl-containing group (for example, acetylene, phenylacetylene, a substituted phenylacetylene, or a substituted acetylene). The further description of this synthesis is provided in WO 97/10193 (Babb).

The ethynyl aromatic monomer of the formula (I) is useful for preparing the polymer of either the formula (II) or (III). Polymerization of the ethynyl aromatic monomer is well within the capabilities of those skilled in the art. While the specific conditions of the polymerization will depend on a variety of factors, including the specific ethynyl aromatic monomer (s) to be polymerized and the desired properties of the resulting polymer, the general conditions of the polymerization are detailed in WO 97/10193 (Babb)

Polyarylenes particularly suitable for use in the present invention include those sold as SiLK™ semiconductor dielectrics (available from DOW ELECTRONIC MATERIALS, based in Marlborough, MA). Other particularly suitable polyarylenes are disclosed in WO 00/31183, WO 98/11149, WO 97/10193, WO 91/09081, EP 755957, and U.S. Pat. Nos. 5,115,082; 5,155,175; 5,179,188; 5,874,516; and 6,093,636.

A suitable cyclic olefin material is a poly(cyclic olefin), which may be thermoplastic and may have a weight average molecular weight (Mw) of preferably 2000 to 200,000 Daltons, more preferably 5000 to 100,000 Daltons, and even more preferably 2000 to 50,000 Daltons. Preferred poly(cyclic olefin)s have a softening temperature (melt viscosity at 3,000 PaS) of at least 100° C., more preferably at least 140° C. Suitable poly(cyclic olefin)s also preferably have a glass transition temperature (Tg) of at least 60° C., more preferably 60 to 200° C., and most preferably 75 to 160° C.

Preferred poly(cyclic olefin)s have repeating monomers of a cyclic olefin and an acyclic olefin, or a ring-opened polymer based on cyclic olefins. Suitable cyclic olefins for use in the present invention are selected from norbornene-based olefins, tetracyclododecene-based olefins, dicyclopentadiene-based olefins, Diels-Alder polymers such as those derived from furan and maleimide, and derivatives thereof. Examples of the derivative include derivatives substituted with alkyl (preferably $C_1$-$C_{20}$ alkyl, more preferably $C_1$-$C_{10}$ alkyl), alkylidene (preferably $C_1$-$C_{20}$ alkylidene, more preferably $C_1$-$C_{10}$ alkylidene), aralkyl (preferably $C_6$-$C_{30}$ aralkyl, more preferably $C_6$-$C_{18}$ aralkyl), cycloalkyl (preferably $C_3$-$C_{30}$ cycloalkyl, more preferably $C_3$-$C_{18}$ cycloalkyl), ether, acetyl, aromatic, ester, hydroxy, alkoxy, cyano, amide, imide, and silyl. Particularly preferred cyclic olefins for use in the present invention include those selected from the following and combinations thereof:

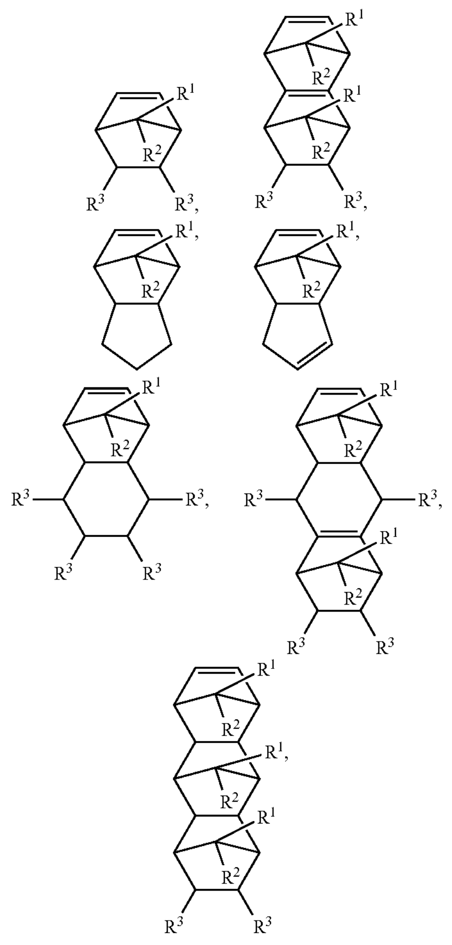

wherein each $R^1$ and $R^2$ is independently selected from H and an alkyl group (preferably $C_1$-$C_{20}$ alkyls, more preferably $C_1$-$C_{10}$ alkyls), and each $R^3$ is independently selected from H, substituted and unsubstituted aryl groups (preferably $C_6$-$C_{18}$ aryls), alkyl groups (preferably $C_1$-$C_{20}$ alkyls, more preferably $C_1$-$C_{10}$ alkyls), cycloalkyl groups (preferably $C_3$-$C_{30}$ cycloalkyl groups, more preferably $C_3$-$C_{18}$ cycloalkyl groups), aralkyl groups (preferably $C_6$-$C_{30}$ aralkyls, more preferably $C_6$-$C_{18}$ aralkyl groups, for example benzyl, phenethyl, phenylpropyl, etc.), ester groups, ether groups, acetyl groups, alcohols (preferably $C_1$-$C_{10}$ alcohols), aldehyde groups, ketones, nitriles, and combinations thereof.

Preferred acyclic olefins are selected from branched and unbranched $C_2$-$C_{20}$ alkenes (preferably $C_2$-$C_{10}$ alkenes). More preferably, the acyclic olefin has the structure of $(R^4)_2C{=}C(R^4)_2$, wherein each $R^4$ is independently selected from H and alkyl groups (preferably $C_1$-$C_{20}$ alkyls, more preferably $C_1$-$C_{10}$ alkyls). Particularly preferred acyclic olefins for use in the present invention include those selected from ethene, propene, and butene, with ethene being most preferred.

Methods for producing the cyclic olefin copolymer are known in the art. For example, the cyclic olefin copolymer can be produced through chain polymerization of a cyclic monomer and an acyclic monomer. When norbornene reacts with ethene under these conditions, an ethene-norbornene copolymer containing alternating norbornanediyl units and ethylene units is obtained. Examples of copolymers produced by this method include those available under the TOPAS™ (produced by Topas Advanced Polymers) and APEL™ (produced by Mitsui Chemicals, Inc.) brands. Suitable methods for producing these copolymers are disclosed in U.S. Pat. No. 6,008,298. Cycloolefin copolymers can also be produced through ring-opening metathesis polymerization of various cyclic monomers followed by hydrogenation. Polymers resulting from this type of polymerization can be conceptually considered as a copolymer of ethene and a cyclic olefin monomer (e.g., alternating units of ethylene and cyclopentane-1,3-diyl). Examples of copolymers produced through this ring opening method include those provided under the ZEONOR™ (from Zeon Chemicals) and ARTON™ (from JSR Corporation) brands. Suitable methods for producing these copolymers through this ring opening method are disclosed in U.S. Pat. No. 5,191,026.

Arylcyclobutene oligomers useful as the curable adhesive material of the present invention are well known in the art. Suitable aryl cyclobutene oligomers include, but are not limited to, those having the following formula:

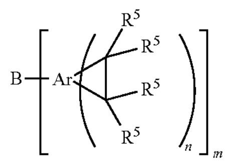

wherein B is an n-valent linking group; Ar is a polyvalent aryl group, and the carbon atoms of the cyclobutene ring are bonded to adjacent carbon atoms on the same aromatic ring as Ar; m is an integer of 1 or more; and n is an integer of 1 or more; and $R^5$ is a monovalent group. Preferably, the polyvalent aryl group Ar may be composed of 1 to 3 aromatic carbocyclic or heteroaromatic rings. The aryl group preferably contains a single aromatic ring, more preferably a phenyl ring. The aryl group is optionally substituted with: one to three groups selected from $(C_1\text{-}C_6)$alkyl, tri $(C_1\text{-}C_6)$alkylsilyl, $(C_1\text{-}C_6)$alkoxy, and halo; preferably one or more of $(C_1\text{-}C_6)$alkyl, tri $(C_1\text{-}C_3)$alkylsilyl, $(C_1\text{-}C_3)$alkoxy, and chloro; and more preferably one or more of $(C_1\text{-}C_3)$alkyl, tri $(C_1\text{-}C_3)$alkylsilyl, and $(C_1\text{-}C_3)$alkoxy. The aryl group is preferably unsubstituted. n=1 or 2 is preferable, and n=1 is more preferable. m=1 to 4 is preferable, m=2 to 4 is more preferable, and m=2 is still more preferable. Preferably, $R^5$ is selected from H and $(C_1\text{-}C_6)$alkyl, more preferably H and $(C_1\text{-}C_3)$alkyl. Preferably, B has one or more carbon-carbon double bonds (ethylenically unsaturated). Suitable monovalent B groups preferably have the formula $-[C(R^{10})=CR^{11}]xZ$ wherein $R^{10}$ and $R^{11}$ are independently selected from hydrogen, $(C_1\text{-}C_6)$alkyl, and aryl; Z is selected from hydrogen, $(C_1\text{-}C_6)$alkyl, aryl, siloxanyl, and $—CO_2R^{12}$; each $R^{12}$ is independently selected from H, $(C_1\text{-}C_6)$alkyl, aryl, aralkyl, and alkaryl; and x=1 or 2. Preferably, $R^{10}$ and $R^{11}$ are independently selected from H, $(C_1\text{-}C_3)$alkyl, and aryl, more preferably selected from H and $(C_1\text{-}C_3)$alkyl. $R^{12}$ is preferably $(C_1\text{-}C_3)$alkyl, aryl, or aralkyl. Z is preferably siloxyl. Preferred siloxyl groups have the formula $-[Si(R^{13})_2—O]p\text{-}Si\ (R^{13})_2—$, wherein each $R^{13}$ is independently selected from H, $(C_1\text{-}C_6)$alkyl, aryl, aralkyl, and alkaryl; and p is an integer of 1 or more. $R^{13}$ is selected from $(C_1\text{-}C_3)$alkyl, aryl, and aralkyl. Suitable aralkyl groups include benzyl, phenethyl, and phenylpropyl.

Preferably, the aryl cyclobutene oligomer includes one or more oligomers of the following formula:

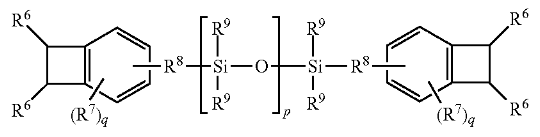

wherein each $R^6$ is independently selected from H and $(C_1\text{-}C_6)$alkyl, preferably selected from H and $(C_1\text{-}C_3)$ alkyl; each $R^7$ is independently selected from $(C_1\text{-}C_6)$ alkyl, tri $(C_1\text{-}C_6)$alkylsilyl, $(C_1\text{-}C_6)$alkoxy, and halo; each $R^8$ is independently a divalent ethylenically unsaturated organic group; each $R^9$ is independently selected from H, $(C_1\text{-}C_6)$alkyl, aralkyl, and phenyl; p is an integer of 1 or more; and q is an integer of 0 to 3. Each $R^6$ is preferably independently selected from H and $(C_1\text{-}C_3)$alkyl, and more preferably each $R^6$ is H. Each R7 is preferably independently selected from $(C_1\text{-}C_6)$alkyl, tri $(C_1\text{-}C_3)$alkylsilyl, $(C_1\text{-}C_3)$alkoxy, and chloro, more preferably from $(C_1\text{-}C_3)$alkyl, tri $(C_1\text{-}C_3)$ alkylsilyl, and $(C_1\text{-}C_3)$alkoxy. Preferably, each $R^8$ is independently selected from $(C_2\text{-}C_6)$alkenyl, and more preferably each $R^8$ is —CH═CH—. Each $R^9$ is preferably selected from $(C_1\text{-}C_3)$alkyl, and more preferably each $R^9$ is methyl. Preferably p=1 to 5, more preferably p=1 to 3, and even more preferably p=1. It is preferable that q=0. A particularly preferred aryl cyclobutene oligomer, 1,3-bis(2-bicyclo[4.2.0]octa-1,3,5-triene-3-ylethenyl)-1,1,3,3-tetramethyldisiloxane ("DVS-bisBCB"), has the following formula.

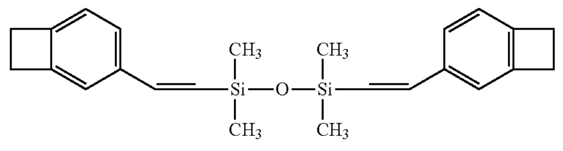

Arylcyclobutene oligomers can be prepared by any suitable method, for example by the method disclosed in U.S. Pat. Nos. 4,812,588; 5,136,069; and 5,138,081, and WO 94/25903. Suitable aryl cyclobutene oligomers are also commercially available under CYCLOTENE™ brand, which is available from DOW ELECTRONIC MATERIALS. The aryl cyclobutene oligomers may be used as they are or may be further purified by any suitable method.

Vinyl aromatic oligomers that can be cured may be used as the curable adhesive material in the present invention. Such vinyl aromatic oligomers are usually an oligomer of one or more reactive ethylenically unsaturated comonomer and a vinyl aromatic monomer. Preferably, the vinyl aromatic monomer contains one vinyl group. A suitable vinyl aromatic monomer is an unsubstituted vinyl aromatic monomer and a substituted vinyl aromatic monomer, wherein one or more hydrogens are replaced with a substituent selected from the group consisting of ($C_1$-$C_6$)alkyl, ($C_1$-$C_6$)alkoxy, halo, and amino. Exemplary vinyl aromatic monomers include, but are not limited to, styrene, vinyltoluene, vinylxylene, vinylanisole, vinyldimethoxybenzene, vinylaniline, halostyrenes such as fluorostyrene, α-methylstyrene, β-methoxystyrene, ethylvinylbenzene, vinylpyridine, vinylimidazole, vinylpyrrole, and mixtures thereof. Preferred vinyl aromatic monomers are styrene, vinyl toluene, vinyl xylene, vinyl anisole, ethyl vinyl benzene, and mixtures thereof. A preferred reactive comonomer contains, in addition to the olefinic (or ethylenically unsaturated) moiety used to form a vinyl aromatic oligomer, a reactive moiety, i.e., a moiety that is capable of further polymerization (or crosslinking) after forming a vinyl aromatic oligomer, for example, an allylic moiety or a vinyl group. Such a reactive comonomer may preferably be any asymmetric diene or triene that can be further polymerized through Diels-Alder reaction after oligomerization with a vinyl aromatic monomer. More preferably, the reactive comonomer contains an allyl moiety in addition to the ethylenic unsaturation used to form a vinyl aromatic oligomer, and even more preferably contains an allyl ester moiety in addition to this ethylenic unsaturation. Exemplary reactive comonomers useful to form a vinyl aromatic oligomer include, but are not limited to, vinylcyclohexene, vinyl ethers, asymmetric dienes or trienes, such as terpene monomers, dicyclopentadiene, diallyl maleate, allyl acrylate, allyl methacrylate, allyl cinnamate, diallyl fumarate, allyl tigrate, divinylbenzene, and mixtures thereof. Preferred reactive comonomers are diallyl maleate, allyl acrylate, allyl methacrylate, allyl cinnamate, diallyl fumarate, and mixtures thereof, more preferably diallyl maleate, allyl methacrylate, and mixtures thereof. Exemplary terpene monomers include, but are not limited to, limonene, dipentene, myrcene, and the like. It will be appreciated by those skilled in the art that one or more second comonomers may also be used to form a vinyl aromatic oligomer. Such a second comonomer is ethylenically unsaturated, but does not contain any reactive moieties. Exemplary second comonomers include, but are not limited to, (meth)acrylic acid, (meth) acrylamide, (C1-C10)alkyl (meth)acrylate, aromatic(meth)acrylate, substituted ethylene monomers, and poly(alkyleneoxide) monomers.

The molar ratio of vinyl aromatic monomer:comonomer in such a vinyl aromatic oligomer is preferably 99:1 to 1:99, more preferably 95:5 to 5:95, and even more preferably 90:10 to 10:90. Such vinyl aromatic oligomers may be prepared by any suitable method, for example by any of the methods known in the art. Typically, the vinyl aromatic oligomer is prepared through free radical polymerization of the vinyl aromatic monomer and the comonomers. A preferred vinyl aromatic oligomer contains an unreacted allyl moiety capable of further curing such an oligomer.

A wide variety of materials may be used as the release additive in the temporary bonding composition, and these materials do not react with the adhesive material under the conditions of storage and use, and are non-curable under the conditions used to cure the adhesive material. In addition, the release additive should be compatible with the temporary bonding composition. That is, the release additive should be dispersible, miscible, or otherwise substantially compatible with the adhesive material and any other components used in the temporary bonding composition, for example, organic solvents. When an organic solvent (or mixed solvent system) is used in the temporary bonding composition, the release additive and the curable adhesive material are required to be soluble in such a solvent. The release additive in the present invention is sufficiently non-volatile so that they do not substantially evaporate under the conditions of use. That is, they do not substantially evaporate during the deposition step, for example spin coating, or any subsequent heating step used to remove the organic solvent or to cure the adhesive material. When the film or layer of the temporary bonding composition is cast, for example, by spin coating, a large amount of (or the entirety of) the solvent is evaporated. The release additive is soluble in any organic solvent used, but preferably is not completely soluble in the curable adhesive material. The release additive is more hydrophilic than the cured adhesive material. Without being bound by theory, it is believed that, when the adhesive material is cured, a release additive phase separates and preferentially migrates towards the active surface (the surface that is more hydrophilic than the carrier surface) of the wafer. The use of a suitable hydrophilic moiety in the release additive allows complete dispersion, or preferably dissolution, of the release additive in the temporary bonding composition, and allows phase separation of the release additive when the adhesive material is cured and the release additive moves towards the more hydrophilic surface. No material which does not phase-separate from the adhesive material in curing functions as the release additive according to the present invention.

In general, the release additive contains one or more relatively hydrophilic moieties, such as one or more moieties containing oxygen, nitrogen, phosphorus, and sulfur. Suitable release additives include, but are not limited to: ethers, esters, carboxylates, alcohols, thioethers, thiols, amines, imines, amides, phosphate esters, sulfonate esters, and mixtures thereof.

Preferably, the release additive contains one or more polar end groups, which contain one or more of oxygen, nitrogen, and sulfur, preferably oxygen. Exemplary polar end groups include alkoxy, aryloxy, hydroxy, carboxylate, alkoxycarbonyl, mercapto, alkylthio, primary amine, secondary amine, and tertiary amine. Preferred end groups are selected from ($C_1$-$C_6$)alkoxy, ($C_6$-$C_{10}$) aryloxy, hydroxy, carboxylate, ($C_1$-$C_6$)alkoxycarbonyl, mercapto, ($C_1$-$C_6$)alkylthio, amino, ($C_1$-$C_6$)alkylamino, and di($C_1$-$C_6$)alkylamino, more preferably selected from ($C_1$-$C_6$)alkoxy, ($C_6$-$C_{10}$) aryloxy, hydroxy, carboxylate, and ($C_1$-$C_6$)alkoxycarbonyl, even more preferably selected from ($C_1$-$C_6$)alkoxy, hydroxy, carboxylate, and ($C_1$-$C_6$)alkoxycarbonyl. Particularly preferred polar end groups are selected from hydroxy, methoxy, ethoxy, propoxy, butoxy, carboxyl, and acetoxy. Preferably, the release additive contains no silicon.

A suitable release additive has a number average molecular weight (Mn) of ≤10,000 Daltons, preferably≤7500 Daltons, more preferably ≤7000 Daltons. The release additive has a minimum molecular weight (Mn) sufficient to render the release additive substantially non-volatile during the conditions of use (That is, <5%, preferably <3%, more preferably ≤1% of the release additive volatilizes during use.). Preferably, the release additive has an Mn of ≥500 Daltons. The preferred range of Mn is 500 to 10,000 Daltons, more preferably 500 to 7500 Daltons, even more preferably 500 to 7000 Daltons. The release additive may be a linear polymer; a branched polymer, such as a dendritic polymer, a star-like polymer, etc; and a polymer particle. The release additive is preferably a linear polymer or a polymer particle, and more preferably a linear polymer. Without being bound by theory, it is believed that a linear polymer can move better through the curable adhesive material phase towards the hydrophilic wafer surface as compared to a branched polymer.

The release additive is preferably a polyether. The polyether compounds include alkylene oxide homopolymers and alkylene oxide copolymers. Such copolymers may be random or block. The polyalkylene oxide release additive may have a variety of polar end groups. Preferably, such polar end groups are hydroxy, $(C_1-C_6)$alkoxy, and $(C_1-C_6)$ alkoxycarbonyl, more preferably hydroxy, $(C_1-C_3)$alkoxy, and acetoxy. Preferred polyether compounds are polyglycols (or polyalkylene oxides), for example poly$(C_1-C_4)$alkylene oxide compounds, which may have a single type of alkylene oxide repeating unit or two or more different alkylene oxide repeating units. Preferred polyether compounds include polyethylene glycol, polypropylene glycol, poly(1,3-propanediol), poly(tetrahydrofuran), ethylene oxide-propylene oxide copolymers, ethylene oxide-butylene oxide copolymers, and mixtures thereof. Preferably, when the release additive has butylene oxide as a repeating unit, it is a copolymer with one or more different alkylene oxide repeating units. Those skilled in the art appreciate that a mixture of release additives may be used in the temporary bonding composition of the present invention. Suitable release additives include polyethers sold under the product name PLURONIC™, TETRONIC, and POLYTHF (available from BASF, Ludwigshafen, Germany), product name FORTEGRA (THE DOW CHEMICAL COMPANY, based in Midland, Michigan), and product name TERATHANE (available from Invista, based in Wichita, Kansas), all of which may be used without further purification.

Third Embodiment

As a preferred embodiment, the adhesive composition used in the present invention contains, for example, a thermosetting polymer described below.

For the adhesive composition of the third embodiment, for example, the thermosetting polymer described in Japanese Patent No. 6528747 can be used.

The thermosetting polymer is not particularly limited, and preferable examples thereof include a siloxane bond-containing polymer (hereinafter, also referred to as silicone A) having a weight average molecular weight of 3,000 to 500,000 and having: a repeating unit represented by the following formula (3); and, as necessary, a repeating unit represented by the following formula (4):

(3)

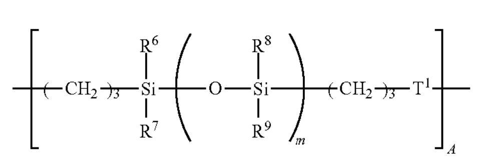

(4)

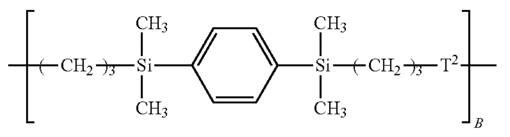

wherein $R^6$ to $R^9$ each independently represent a monovalent hydrocarbon group having 1 to 8 carbon atoms; m represents an integer of 1 to 100; A and B are positive numbers satisfying 0<A<1, 0<B<1, and A+B=1; $T^1$ and $T^2$ are a divalent organic group represented by the following formula (5):

(5)

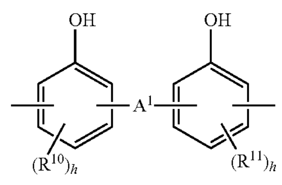

wherein $A^1$ is a single bond or a divalent organic group selected from the groups represented by the following formula:

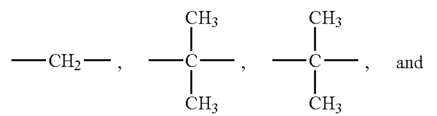

and

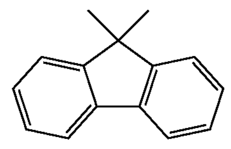

wherein $R^{10}$ and $R^{11}$ are each independently an alkyl group or alkoxy group having 1 to 4 carbon atoms; and h is each independently 0, 1, or 2.

Examples of the monovalent hydrocarbon group represented by $R^6$ to $R^9$ include alkyl groups, such as a methyl group and an ethyl group, and aryl groups, such as a phenyl group. m is preferably an integer of 3 to 60, more preferably 8 to 40. In addition, A is preferably 0.3 to 0.8, B is preferably 0.2 to 0.7, and A/B preferably satisfies 0.1 to 20 and more preferably satisfies 0.5 to 5.

Preferable examples of the thermosetting polymer include a siloxane bond-containing polymer (hereinafter, also referred to as silicone B) having a weight average molecular weight of 3,000 to 500,000 and having: a repeating unit represented by the following formula (6); and, as necessary, a repeating unit represented by the following formula (7):

(6)

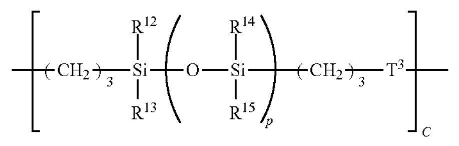

(7)

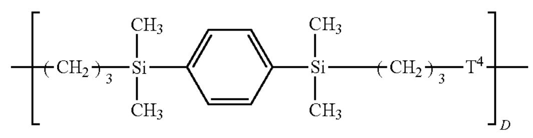

wherein $R^{12}$ to $R^{15}$ each independently represent a monovalent hydrocarbon group having 1 to 8 carbon atoms; p represents an integer of 1 to 100; C and D are a positive number satisfying 0<C≤1, 0≤D<1, and C+D=1; and $T^3$ and $T^4$ are a divalent organic group represented by the following formula (8):

(8)

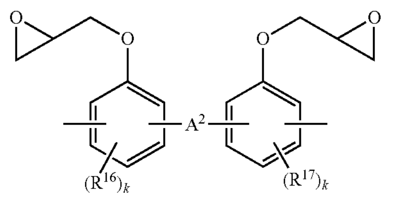

wherein $A^2$ is a single bond or a divalent organic group selected from the groups represented by the following formula:

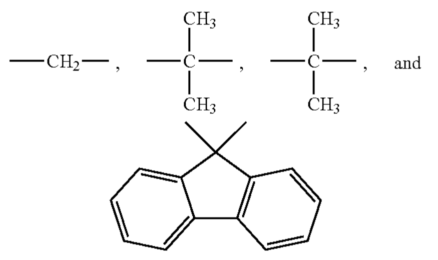

and wherein $R^{16}$ and $R^{17}$ are each independently an alkyl group or alkoxy group having 1 to 4 carbon atoms; and k is each independently 0, 1, or 2.

In this case, examples of the monovalent hydrocarbon group represented by $R^{11}$ to $R^{14}$ include the same groups as those exemplified as those represented by $R^5$ to $R^8$. p is preferably an integer of 3 to 60, more preferably 8 to 40. In addition, C is preferably 0.3 to 1, D is preferably 0 to 0.7, and C+D=1.

The adhesive layer formed using the thermosetting polymer as the adhesive composition of the third embodiment is preferably a layer of the cured product of a thermosetting resin composition containing the silicone A or the silicone B as a main component. The silicone A and the silicone B can be used in combination. In this case, the ratio (polymerization ratio) is preferably silicone A silicone B=0.1:99.9 to 99.9: 0.1, and more preferably silicone A silicone B=20: 80 to 80: 20.

The thermosetting resin composition containing the silicone A as a main component contains, for its thermal curing, one or more crosslinking agents selected from an amino condensate modified with formalin or formalin-alcohol, a phenol compound having two or more methylol groups or alkoxymethylol groups on average in one molecule, and an epoxy compound having two or more epoxy groups on average in one molecule.

On the other hand, the thermosetting resin composition containing the silicone B as a main component contains one or more crosslinking agents selected from a phenol compound having two or more phenol groups on average in one molecule and an epoxy compound having two or more epoxy groups on average in one molecule for thermal curing thereof.

In addition, the thermosetting resin composition containing the silicone A and the silicone B contains one or more crosslinking agents selected from epoxy compounds having two or more epoxy groups on average in one molecule for thermal curing thereof.

Examples of the amino condensate include a melamine resin and a urea resin. Examples of the melamine resin modified with formalin or formalin-alcohol include ones obtained by the following: a modified melamine monomer (for example, trimethoxymethyl monomethylol melamine) or a multimer thereof (for example, oligomers such as dimers and trimers) are subjected to an addition condensation polymerization with formaldehyde according to a known method to have a desired molecular weight. These can be used singly or in combination of two or more kinds thereof.

Examples of the urea resin modified with formalin or formalin-alcohol include methoxymethylated urea condensates, ethoxymethylated urea condensates, propoxymethylated urea condensates, and the like. These can be used singly or in combination of two or more kinds thereof. The urea resin modified with formalin or formalin-alcohol can be prepared by, for example, methylol formation modification of a urea condensate having a desired molecular weight with formalin, or further alkoxylation modification thereof with an alcohol, according to a known method.

Examples of the phenol compound having two or more methylol groups or alkoxymethylol groups on average in one molecule include (2-hydroxy-5-methyl)-1,3-benzenedimethanol and 2,2',6,6'-tetramethoxymethylbisphenol A. These can be used singly or in combination of two or more kinds thereof.

The epoxy compound having two or more epoxy groups on average in one molecule is not particularly limited. Examples thereof include: bifunctional, trifunctional, or tetrafunctional or higher polyfunctional epoxy resins, such as EOCN-1020 (see the following formula), EOCN-102S, XD-1000, NC-2000-L, EPPN-201, GAN, and NC6000, which are manufactured by Nippon Kayaku Co., Ltd.; and compounds represented by the following formulas.

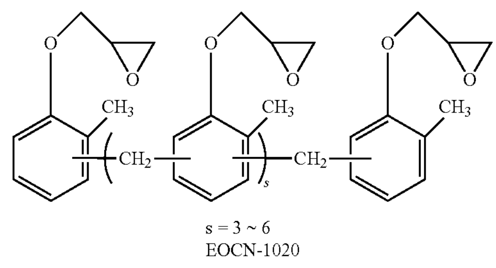

s = 3 ~ 6

EOCN-1020

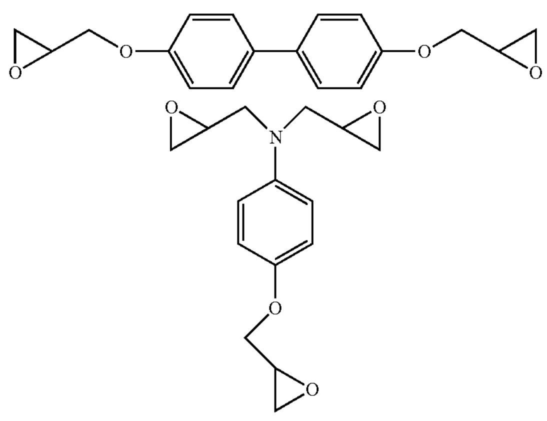

-continued

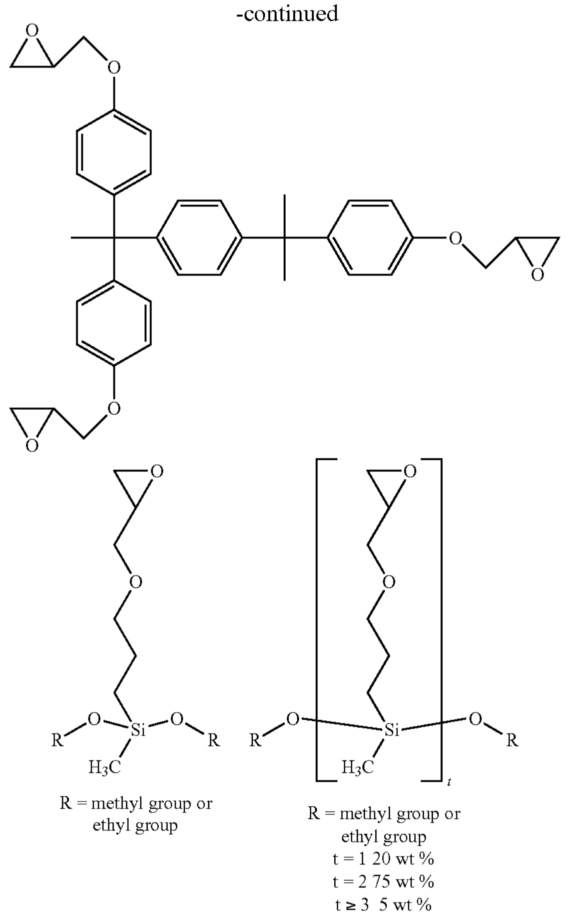

R = methyl group or ethyl group

R = methyl group or ethyl group
t = 1 20 wt %
t = 2 75 wt %
t ≥ 3 5 wt %

Examples of the phenol compound having two or more phenol groups on average in one molecule include m- or p-cresol novolac resins (for example, EP-6030G, which is manufactured by ASAHI YUKIZAI KOGYO), trifunctional phenol compounds (for example, Tris-P-PA, which is manufactured by Honshu Chemical Industry Co., Ltd.), and tetrafunctional phenol compounds (for example, TEP-TPA, which is manufactured by ASAHI YUKIZAI KOGYO).

The blending amount of the crosslinking agent in the thermosetting resin composition is preferably 0.1 to 50 parts by mass, more preferably 0.2 to 30 parts by mass, and still more preferably 1 to 20 parts by mass, based on 100 parts by mass of the thermosetting polymer. The crosslinking agent can be used singly or in combination of two or more kinds thereof.

In the thermosetting resin composition, a curing catalyst such as an acid anhydride may be blended in an amount of 10 parts by mass or less based on 100 parts by mass of the thermosetting polymer.

Fourth Embodiment

As a preferable embodiment, the adhesive composition used in the present invention contains, for example, a compound selected from the group consisting of polymers and oligomers of imide, amideimide, and amideimide-siloxane, each of which is contained in the thermoplastic composition for forming a bonding composition layer described in Japanese Patent No. 5788173.

The compound is, for example, selected from the group consisting of a polymer and an oligomer having a repeating unit of at least one of the following formula (I) and the following formula (II):

Formula (I)

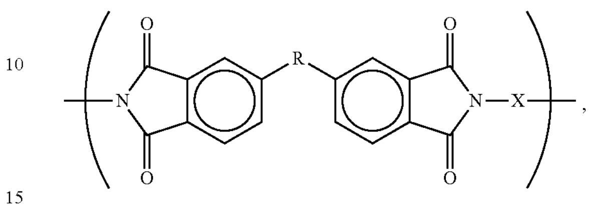

wherein, R is selected from the group consisting of:

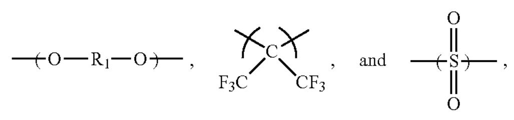

wherein $R_1$ is selected from the group consisting of: an alkyl-substituted phenyl,

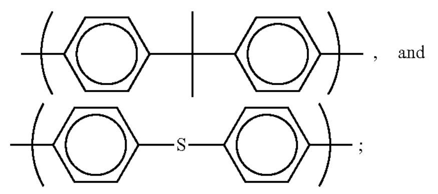

Formula (II)

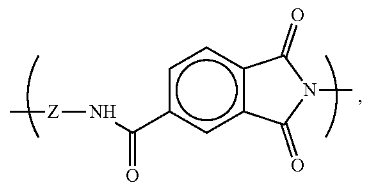

wherein Z is selected from the group consisting of a siloxane and a moiety having an ether bridge.

A preferred alkyl-substituted phenyl is a $C_1$-$C_6$ alkyl-substituted phenyl. Particularly preferred examples of the alkyl-substituted phenyl is selected from the group consisting of:

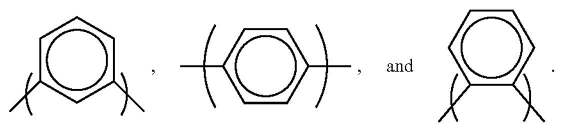

In the formula (I), X is selected from the group consisting of phenyl sulfone, (preferably $C_6$ to $C_{60}$, more preferably $C_6$ to $C_{30}$, further preferably $C_6$ to $C_{24}$) aromatic compounds, (preferably $C_2$ to $C_{15}$, more preferably $C_2$ to $C_{10}$, even more preferably $C_2$ to $C_6$) aliphatic compounds, and (preferably $C_4$ to $C_{60}$, more preferably $C_4$ to $C_{20}$, even more preferably $C_4$ to $C_{12}$) alicyclic compounds.

In an embodiment, X may be an aromatic group, an aliphatic group, or an alicyclic group as described above. In another embodiment, X may include an aromatic group having an ether bridge (as discussed with respect to Z) or an aromatic group having a linking group and/or an —$NH_2$ group in the meta position.

Particularly preferred X groups are selected from the group consisting of alkyl-substituted phenyl(as described above), isopropylidenediphenyl, and hexafluoroisopropylidene.

In the formula (II), in an embodiment where Z is a siloxane, preferred siloxanes are represented by the Formula:

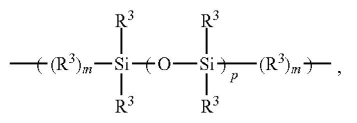

wherein each $R^3$ is selected from the group consisting of hydrogen, (preferably $C_1$-$C_{10}$, more preferably $C_1$-$C_2$) alkyl, and phenyl;

m is 1 to 6; and p is 1 to 50, preferably 1 to 20, more preferably 1 to 10.

In the formula (II), preferred moieties having an ether bridge as Z are selected from the group consisting of:

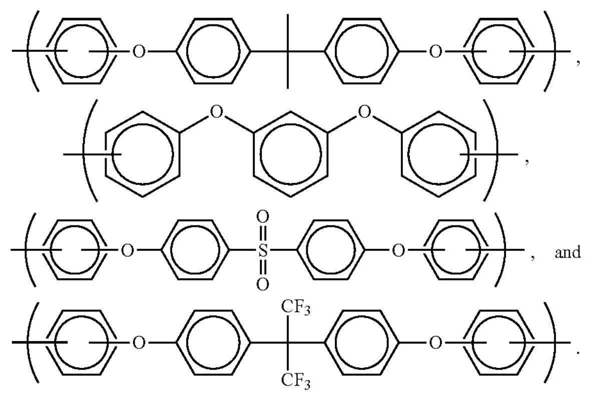

In the embodiment of the formula (I) or the formula (II), it is preferable that the polymer or oligomer further has a terminal blocking group. Preferred terminal blocking groups are derived from compounds selected from the group consisting of aromatic monoamines, aliphatic monoamines, alicyclic monoamines, and phthalic anhydride. Particularly preferred terminal blocking groups have a group selected from the group consisting of (preferably $C_1$ to $C_{15}$, more preferably $C_1$ to $C_{10}$, even more preferably $C_1$ to $C_6$)alkyl,

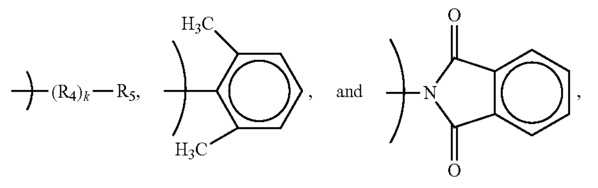

wherein $R_4$ is (preferably $C_1$ to $C_{15}$, more preferably $C_1$ to $C_{10}$, even more preferably $C_1$ to $C_6$)alkyl; $R_5$ is (preferably $C_3$ to $C_{12}$, more preferably $C_5$ to $C_6$) alicyclic group; and k is 0 to 20, preferably 0 to 10, more preferably 0 to 5.

The polymeric or oligomeric compound of imide, amide-imide, and amideimide-siloxane is thermoplastic, and preferably has a weight average molecular weight of about 3000 Daltons to about 300000 Daltons, more preferably about 6000 Daltons to about 50000 Daltons. Preferred compounds preferably have a softening temperature (at a melt viscosity of 3000 Pa·s) of at least about 150° C., more preferably at least about 200° C., and even more preferably about 200° C. to about 250° C.

The amount of the film constituent component in the bonding composition should be at least about 10 mass %, preferably about 10 mass % to about 40 mass %, and more preferably about 10 mass % to about 30 mass % based on 100 mass % of the total mass of the composition.

The adhesive composition used in the present invention may contain a solvent for the purpose of adjusting the viscosity. Specific examples thereof include aliphatic hydrocarbons, aromatic hydrocarbons, and ketones, but are not limited thereto.

More specific examples of the solvent include hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone, but are not limited thereto. Such solvents can be used singly or in combination of two or more kinds thereof.

When the adhesive composition used in the present invention contains a solvent, the content thereof is appropriately determined in consideration of the desired viscosity of the composition, the coating method to be employed, the thickness of the film to be produced, and the like, and is in a range of about 10 to 90 mass % with respect to the entire composition.

The viscosity of the adhesive composition used in the present invention is not particularly limited, but is usually 500 to 20,000 mPa·s, and preferably 1,000 to 5,000 mPa·s at 25° C. The viscosity of the adhesive composition used in the present invention can be adjusted by changing the type of solvent to be used, the ratio thereof, the concentration of the film constituent components, and the like, in consideration of various factors such as the coating method to be used and the desired film thickness.

An example of the adhesive composition used in the present invention can be produced by mixing the component (A) with the component (B) and a solvent, which are optionally used.

The mixing order is not particularly limited, and an example of the method by which the adhesive composition can be easily and reproducibly produced include, but are not limited to, a method in which the component (A) and the component (B) are dissolved in a solvent, and a method in which a part of the component (A) and the component (B) are dissolved in a solvent, the rest is dissolved in a solvent, and the resulting solutions are mixed. When the adhesive composition is prepared, heating may be appropriately performed as long as the components are not decomposed or altered.

In the present invention, for the purpose of removing foreign substances, a solvent, a solution, or the like to be used may be filtered using a filter or the like during the production of the adhesive composition or after mixing all the components.

The thickness of the adhesive layer included in the laminate of the present invention is not particularly limited, and is usually 5 to 500 μm, and is preferably 10 μm or more, more preferably 20 μm or more, still more preferably 30 μm or more from the viewpoint of maintaining the film strength, and is preferably 200 μm or less, more preferably 150 μm or less, still more preferably 120 μm or less, and still more preferably 70 μm or less from the viewpoint of avoiding nonuniformity caused by being a thick film.

The laminate of the present invention is suitably produced, for example, by the method of manufacturing a laminate of the present invention, as follows.

Hereinafter, an example of the laminate is described with reference to the drawing.

FIG. 1 is a schematic cross-sectional view of an example of the laminate.

The laminate of FIG. 1 includes a semiconductor substrate 1, an adhesive layer 2, a release layer 3, and a support substrate 4 in this order.

The adhesive layer 2 and the release layer 3 are provided between the semiconductor substrate 1 and the support substrate 4. The adhesive layer 2 is in contact with the semiconductor substrate 1. The release layer 3 is in contact with the adhesive layer 2 and the support substrate 4.

<Method of Manufacturing Laminate>

The laminate of the present invention can be manufactured, for example, by a method including: step A1 of applying the adhesive composition to the surface of the semiconductor substrate and, if necessary, heating the adhesive composition to form an adhesive application layer; step A2 of applying the release agent composition to the surface of the support substrate and, if necessary, heating the release agent composition to form a release agent application layer; and step A3 of bringing the adhesive application layer on the semiconductor substrate and the release agent application layer on the support substrate into close contact with each other by applying a load in the thickness direction of the semiconductor substrate and the support substrate while performing at least one of a heating treatment and a decompression treatment, and then performing a post-heating treatment to form the laminate.

Alternatively, the laminate of the present invention can be manufactured, for example, by a method including: step B1 of applying the release agent composition to the surface of the semiconductor substrate and, if necessary, heating the release agent composition to form a release agent application layer; step B2 of applying the adhesive composition to the surface of the support substrate and, if necessary, heating the adhesive composition to form an adhesive application layer; and step B3 of bringing the release agent application layer on the semiconductor substrate and the adhesive application layer on the support substrate into close contact with each other by applying a load in the thickness direction of the semiconductor substrate and the support substrate while performing at least one of a heating treatment and a decompression treatment, and then performing a post-heating treatment to form the laminate.

As long as the effect of the present invention is not impaired, application and heating of each composition may be sequentially performed on any one of the substrates.

The application method is not particularly limited, and is usually a spin coating method. Incidentally, it is possible to employ a method of separately forming a coating film by a spin coating method or the like and attaching the sheet-like coating film as the adhesive application layer or the release agent application layer.

The heating temperature of the applied adhesive composition varies depending on the type and amount of the adhesive component contained in the adhesive composition, whether or not a solvent is contained, the boiling point of the solvent used, the desired thickness of the adhesive layer, and the like, and thus cannot be generally specified. The heating temperature is usually 80 to 150° C., and the heating time is usually 30 seconds to 5 minutes.

When the adhesive composition contains a solvent, the applied adhesive composition is usually heated.

The heating temperature of the applied release agent composition varies depending on the type and amount of the acid generator, the boiling point of the solvent to be used, the desired thickness of the release layer, and the like, and thus cannot be generally defined, but the heating temperature is 80° C. or higher from the viewpoint of reproducibly realizing a suitable release layer, and is 300° C. or lower from the viewpoint of suppressing decomposition of the acid generator and the like, and the heating time thereof is usually appropriately determined in the range of 10 seconds to 10 minutes depending on the heating temperature.

When the release agent composition contains a solvent, the applied release agent composition is usually heated.

The heating can be performed using a hot plate, an oven, or the like.

The film thickness of the adhesive application layer obtained by applying the adhesive composition and heating the same as necessary is usually about 5 to 500 μm, and appropriately determined so as to finally fall within the range of the thickness of the adhesive layer described above.

The film thickness of the release agent application layer obtained by applying the release agent composition and heating the same as necessary is usually about 5 nm to 100 μm, and appropriately determined so as to finally fall within the range of the thickness of the release layer described above.

In the present invention, the laminate of the present invention can be obtained by combining such application layers so as to be in contact with each other, bringing the two layers into close contact with each other through applying a load in the thickness direction of the semiconductor substrate and the support substrate while performing a heat treatment, a pressure reduction treatment, or both, and then performing a post-heat treatment. Which treatment condition of heat treatment, pressure reduction treatment, and combination use of both is adopted is appropriately determined in consideration of various circumstances such as the type of the adhesive composition, the specific formulation of the release agent composition, the compatibility of the films obtained from both of the compositions, the film thickness, and the required adhesive strength.

The heat treatment is appropriately determined from the range of usually 20 to 150° C. from the viewpoint that when a solvent is contained in the composition, the solvent is removed, the viewpoint that the adhesive application layer is softened to realize suitable bonding with the release agent application layer, and the like. In particular, from the viewpoint of suppressing or avoiding excessive curing and unnecessary alteration of the adhesive component (A), the heating temperature is preferably 130° C. or lower, more preferably 90° C. or lower, and the heating time is appropriately determined according to the heating temperature and the type of the adhesive, but from the viewpoint of reliably exhibiting suitable adhesion, the heating time is usually 30 seconds or more, and preferably 1 minute or more, but from the viewpoint of suppressing alteration of the adhesive layer and other members, the heating time is usually 10 minutes or less, and preferably 5 minutes or less.

In the pressure reduction treatment, the adhesive application layer and the release agent application layer in contact with each other may be exposed under an atmospheric pressure of 10 to 10,000 Pa. The time for the pressure reduction treatment is usually 1 to 30 minutes.

From the viewpoint of reproducibly obtaining a laminate in which the substrates can be satisfactorily separated, the two layers in contact with each other are bonded to each other preferably by pressure reduction treatment, and more preferably by combined use of heat treatment and pressure reduction treatment.

The load in the thickness direction of the semiconductor substrate and the support substrate is not particularly limited as long as the load does not adversely affect the semiconductor substrate, the support substrate, and the two layers therebetween and can firmly adhere them, and is usually within the range of 10 to 1,000 N.

The temperature for post-heating is preferably 120° C. or higher from the viewpoint of achieving a sufficient curing rate, and is preferably 260° C. or lower from the viewpoint of preventing deterioration of the substrates and each layer.

The post-heating time is usually 1 minute or more, and preferably 5 minutes or more from the viewpoint of realizing suitable bonding of the substrates and the layers constituting the laminate, and is usually 180 minutes or less, and preferably 120 minutes or less from the viewpoint of suppressing or avoiding an adverse effect on each layer due to excessive heating.

The heating can be performed using a hot plate, an oven, or the like. When post-heating is performed using a hot plate, heating may be performed with either the semiconductor substrate or the support substrate of the laminate facing downward, but it is preferable to perform post-heating with the semiconductor substrate facing downward from the viewpoint of reproducibly realizing suitable release.

It is to be noted that one object of the post-heat treatment is to realize the adhesive layer and the release layer, which are more suitable self-supporting films, and to suitably realize, particularly, curing by a hydrosilylation reaction.

(Method for Producing Processed Semiconductor Substrate)

The method for producing a processed semiconductor substrate of the present invention includes a first step and a second step.

The method for producing a processed semiconductor substrate of the present invention may further include a third step.

The first step is a step of processing the semiconductor substrate of the laminate of the present invention.

The second step is a step of separating the semiconductor substrate, which has been processed in the first step, and the support substrate from each other.

The third step is a step of cleaning at least one of the separated semiconductor substrate and the separated support substrate with a cleaning agent composition.

The processing performed on the semiconductor substrate in the first step is, for example, processing on the opposite side of the circuit surface of the wafer, and includes thinning of the wafer by polishing the back surface of the wafer. Thereafter, a through silicon via (TSV) or the like is formed, and thereafter, the thinned wafer is released off from the support substrate to form a laminate of the wafer, and the wafer is three-dimensionally mounted. Before and after that, a wafer back electrode and the like are also formed. In thinning the wafer and in the TSV process, the wafer is applied with heat of about 250 to 350° C. in the state of being bonded to the support substrate. The laminate of the present invention, as well as the adhesive layer and the release layer, usually has heat resistance to the load.

Note that the processing is not limited to the above-described processing, and includes, for example, implementation of a process of mounting a semiconductor component in a case where a base material for mounting a semiconductor component is temporarily bonded to the support substrate to support the base material.

In the second step, examples of the method for separating (releasing) the semiconductor substrate and the support substrate include, but are not limited to, mechanical releasing with equipment having a sharp part, releasing between the support and the wafer, and the like after the release layer is irradiated with light.

By irradiating the release layer with light from the support substrate side, the release layer is deteriorated (for example, separation or decomposition of the release layer) as described above, and thereafter, for example, one of the substrates is pulled up, and the semiconductor substrate and the support substrate can be easily separated.

The release layer is not necessarily irradiated with light in the entire region of the release layer. Even if the region irradiated with light and the region not irradiated with light are mixed, the semiconductor substrate and the support substrate can be separated from each other by a slight external force such as pulling up the support substrate, for example, as long as the releasing ability has been sufficiently improved as the entire release layer. The ratio and positional relationship between the region irradiated with light and the region not irradiated with light vary depending on the type and specific formulation of the adhesive to be used, the thickness of the adhesive layer, the thickness of the release layer, the intensity of light to be irradiated, and the like, but those skilled in the art can appropriately set the conditions without requiring an excessive test. For such circumstances, according to the method of producing a processed semiconductor substrate of the present invention, for example, it is possible to shorten the light irradiation time when releasing is performed by light irradiation from the support substrate side in a case where the support substrate of the laminate to be used has optical transparency. As a result, in addition to the expectation of improvement in throughput, it is possible to easily and efficiently separate the semiconductor substrate and the support substrate by only light irradiation, while avoiding physical stress and the like for releasing.

Usually, the irradiation amount of light for releasing is 50 to 3,000 $mJ/cm^2$. The irradiation time is appropriately determined according to the wavelength and the irradiation amount.

Light irradiation may be performed using laser light, or may be performed using non-laser light from a light source such as an ultraviolet lamp.

In the third step, the surface of at least one of the separated semiconductor substrate and support substrate is cleaned by spraying the cleaning agent composition or immersing the separated semiconductor substrate or support substrate in the cleaning agent composition, and then rinsing and drying using a solvent are usually performed. Examples of the cleaning agent composition include those described above.

In the method for producing a processed semiconductor substrate of the present invention, the processed semiconductor substrate produced through the third step has been favorably cleaned with the cleaning agent composition. However, it is not excluded to further clean the surface of the processed semiconductor substrate using a removal tape or the like, and the surface may be further cleaned using a removal tape or the like as necessary.

The constituent elements and method elements related to the above-described steps of the method for producing a processed semiconductor substrate of the present invention may be variously changed without departing from the gist of the present invention.

The method for producing a processed semiconductor substrate of the present invention may include steps other than the above-described steps.

In the separation method of the present invention, when the semiconductor substrate or the support substrate has optical transparency in the laminate of the present invention, the release layer is irradiated with light from the semiconductor substrate side or the support substrate side to separate the semiconductor substrate and the support substrate in the laminate.

In the laminate of the present invention, the semiconductor substrate and the support substrate are temporarily bonded by the adhesive layer and the release layer so as to be suitably separable. Therefore, for example, when the support substrate has optical transparency, the release layer is irradiated with light from the support substrate side in the laminate, whereby the semiconductor substrate and the support substrate can be easily separated. Usually, releasing is performed after the semiconductor substrate of the laminate is processed.

EXAMPLES

Hereinafter, the present invention will be described more specifically with reference to Examples, but the present invention is not limited thereto.

APPARATUS (1) Optical film thickness meter: F-50; manufactured by Filmetrics, INC.

(2) Transmittance measuring apparatus: UV3600Plus; manufactured by SHIMADZU CORPORATION (3) Vacuum bonding apparatus: manual bonder;

manufactured by SUSS MicroTec SE.

(4) Laser releasing device: NC-LD300-EXC; manufactured by OPTEC

[1] Preparation of Release Agent Composition

Preparation Example 1

Ten grams of tannic acid (manufactured by KANTO CHEMICAL CO., INC.) and 90 g of propylene glycol monomethyl ether acetate (manufactured by Tokyo Chemical Industry Co., Ltd.) were mixed, and the mixture was stirred for 5 minutes using a mix rotor.

Finally, the obtained mixture was filtered through a nylon filter 300 mesh to obtain a release agent composition-1.

Tannic acid: the following structural formula, molecular weight: 1701.2

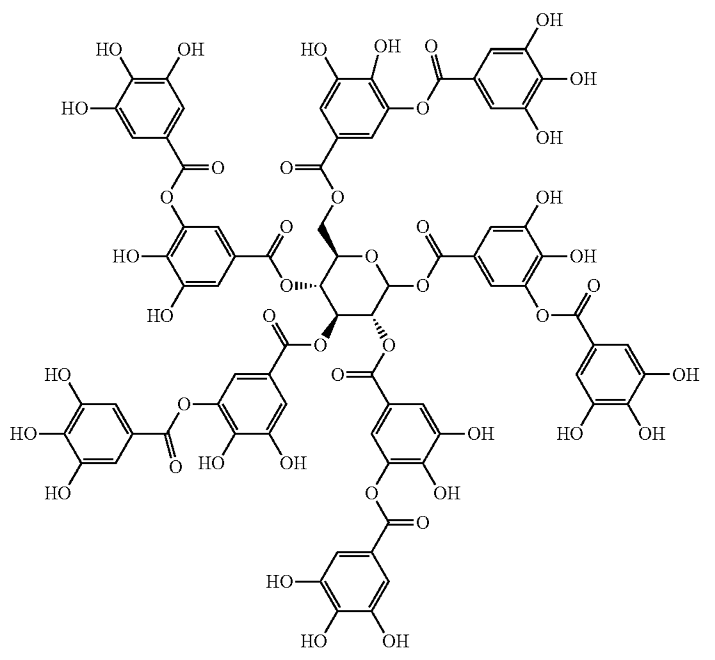 [SMILES: O=C(OC[C@H]1OC(OC(=O)c2cc(O)c(O)c(OC(=O)c3cc(O)c(O)c(O)c3)c2)[C@H](OC(=O)c2cc(O)c(O)c(OC(=O)c3cc(O)c(O)c(O)c3)c2)[C@@H](OC(=O)c2cc(O)c(O)c(OC(=O)c3cc(O)c(O)c(O)c3)c2)[C@@H]1OC(=O)c1cc(O)c(O)c(OC(=O)c2cc(O)c(O)c(O)c2)c1)c1cc(O)c(O)c(OC(=O)c2cc(O)c(O)c(O)c2)c1]

Preparation Example 2

Ten grams of V886 (manufactured by Tokyo Chemical Industry Co., Ltd.) and 90 g of tetrahydrofuran (manufactured by Tokyo Chemical Industry Co., Ltd.) were mixed, and the mixture was stirred for 5 minutes using a mix rotor.

Finally, the obtained mixture was filtered through a nylon filter 300 mesh to obtain a release agent composition-2.

V886: the following structural formula, 9,9'-[1,2-phenylenebis(methylene)]bis[N3,N3,N6,N6-tetrakis(4-methoxyphenyl)-9H-carbazole-3,6-diamine], molecular weight 1345.6

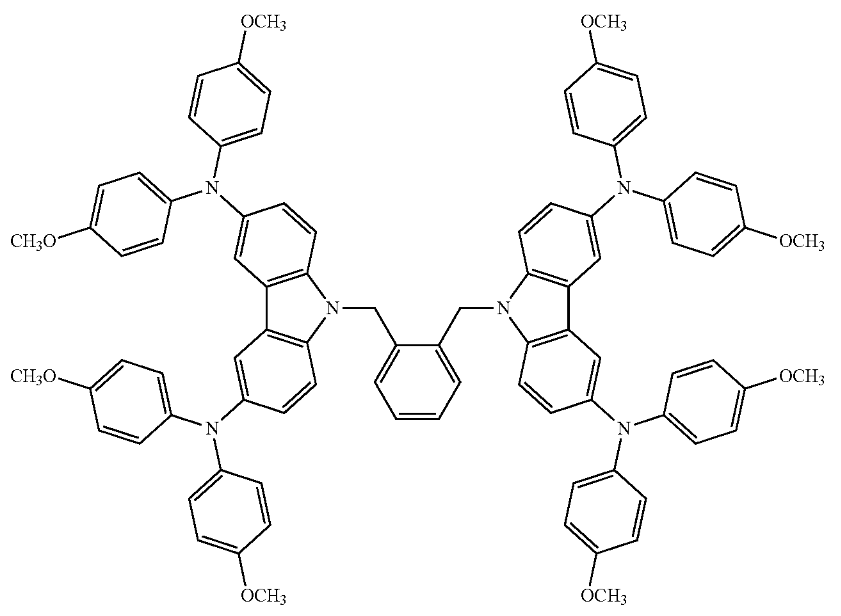

siloxane skeleton and a vinyl group (manufactured by Wacker Chemie AG), 2.52 g of a vinyl group-containing linear polydimethylsiloxane having a viscosity of 100 mPa·s (manufactured by Wacker Chemie AG), 5.89 g of an SiH group-containing linear polydimethylsiloxane having a viscosity of 70 mPa·s (manufactured by Wacker Chemie AG), and 0.22 g of 1-ethynyl-1-cyclohexanol (manufactured by Wacker Chemie AG) were charged, and stirred with a stirrer for 5 minutes to obtain a mixture I.

0.147 g of a platinum catalyst (manufactured by Wacker Chemie AG) and 5.81 g of vinyl group-containing linear polydimethylsiloxane having a viscosity of 1,000 mPa·s Preparation Example 3

Ten grams of carminic acid (manufactured by Tokyo Chemical Industry Co., Ltd.) and 90 g of tetrahydrofuran (manufactured by Tokyo Chemical Industry Co., Ltd.) were mixed, and the mixture was stirred for 5 minutes using a mix rotor.

Finally, the obtained mixture was filtered through a nylon filter 300 mesh to obtain a release agent composition-3.

Carminic acid: the following structural formula, molecular weight 492.4

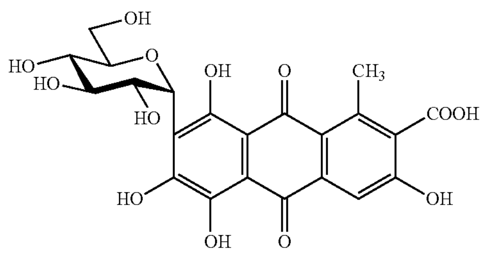

[2] Preparation of Adhesive Composition

Preparation Example 4

In a 600 mL stirring vessel dedicated to a planetary centrifugal mixer, 80 g of an MQ resin containing a poly- (manufactured by Wacker Chemie AG) were stirred with a stirrer for 5 minutes to obtain a mixture II.

To the mixture I, 3.96 g of the mixture II was added, and the resulting mixture was stirred with a stirrer for 5 minutes to obtain a mixture III.

Finally, the obtained mixture III was filtered through a nylon filter 300 mesh to obtain an adhesive composition.

[3] Formation of Thin Film and Measurement of Transmittance

Example 1-1

The release agent composition-1 obtained in Preparation Example 1 was applied onto a quartz substrate using a spin coater, and heated on a hot plate at 200° C. for 5 minutes to form a thin film having a thickness of 200 nm.

Example 1-2

The operation was performed in the same manner as in Example 1-1 except that the release agent composition-2 obtained in Preparation Example 2 was used in place of the release agent composition-1 obtained in Preparation Example 1.

Example 1-3

The operation was performed in the same manner as in Example 1-1 except that the release agent composition-3 obtained in Preparation Example 3 was used in place of the release agent composition-1 obtained in Preparation Example 1.

In order to determine whether the obtained thin film can be used as a layer for laser releasing, the light transmittance at a wavelength of 308 nm and the wavelength showing the maximum value of light absorption were measured. The results are shown in Table 1. The molecular weight of each light-absorbing compound is also shown.

For the measurement of the absorption spectrum and transmittance, UV3600Plus, which is manufactured by SHIMADZU CORPORATION, was used. Quartz substrates coated with the release agent composition obtained in Examples 1-1 to 1-3 and a non-coated quartz substrate as a reference were fixed on a stage in the apparatus, and the absorbance and transmittance of the layers applied on the quartz substrate were measured in a wavelength range of 190 to 800 nm every 0.5 nm.

TABLE 1

| Example | Molecular weight | Transmittance at 308 nm (%) | Wavelength showing maximum value of light absorption (nm) |
|---|---|---|---|
| 1-1 | 1701.2 | 14.5 | 276 |
| 1-2 | 1345.6 | 2.1 | 306 |
| 1-3 | 492.4 | 27.0 | 275 |

As shown in Table 1, it was confirmed that the transmittance was 30% or less at 308 nm, and good light-absorptivity was exhibited in all Examples. The local maximum value of absorption (local maximum value) was around 250 to 350 nm, and it was confirmed that Examples 1-1 to 1-3 showed similar absorption spectra. In addition, the molecular weight of each of the light-absorbing compounds was all 2000 or less.

[4] Confirmation of Optimum Irradiation Amount for Releasing with Laser (308 nm) and Whole Surface Irradiation Example 2-1

The adhesive composition obtained in Preparation Example 4 was applied to a 100 mm silicon wafer (thickness: 500 μm) as a device-side wafer with a spin coater to form a 60 μm thin film. The release agent composition-1 obtained in Preparation Example 1 was applied to a 100 mm glass wafer (EAGLE-XG, manufactured by Corning Incorporated, thickness: 500 μm) as a carrier side wafer (support) with a spin coater, and heated on a hot plate at 200° C. for 5 minutes to form a 200 nm thin film. Bonding was performed so as to sandwich the formed two thin films in the vacuum bonding apparatus, and the resultant was heated for 10 minutes at 200° C. on a hot plate with the wafer on the device side facing down, and the formed thin film was cured to obtain a laminate. Bonding was performed at a temperature of 25° C. and a pressure reduction degree of 1,000 Pa under a load of 30 N.

Example 2-2

A laminate was obtained in the same manner as in Example 2-1, except that the release agent composition-2 obtained in Preparation Example 2 was used in place of the release agent composition-1 obtained in Preparation Example 1.

Example 2-3

A laminate was obtained in the same manner as in Example 2-1, except that the release agent composition-3 obtained in Preparation Example 3 was used in place of the release agent composition-1 obtained in Preparation Example 1.

[[Optimal Irradiation Amount Confirmation]]

The laminate obtained in each of Examples 2-1 to 2-3 was irradiated with a laser having a wavelength of 308 nm from the glass wafer side using the laser irradiation device. At this time, the output was changed, that is, the laser was irradiated one by one changing the output by 50 mJ/cm$^2$ in a range of the output of 100 to 500 mJ/cm$^2$, and whether bubbles were generated and partial releasing occurred in the portion irradiated with the laser was observed. The minimum laser output when bubbles were generated on the entire laser-irradiated portion was defined as the optimum irradiation amount. The results are shown in Table 2.

[[Whole Surface Irradiation]]

In addition, the laminate obtained in the same manner as in Examples 2-1 to 2-3, the whole surface of the wafer was irradiated with a laser having a wavelength of 308 nm from the glass wafer side using the laser irradiation device, and the glass wafer was lifted with tweezers to check if releasing was possible. At this time, the laser was irradiated so as not to overlap front, back, left, and right. In addition, the laser output was set to the above optimum irradiation amount. The results are shown in Table 2.

[5] Confirmation of Substrate-Cleaning Property after Laser Releasing

The glass wafer (support substrate) after laser releasing was cut into a 4 cm square, immersed in 10 ml of OK73 thinner (manufactured by TOKYO OHKA KOGYO CO., LTD.) for 5 minutes. The immersed glass wafer was baked and dried on a hot plate at 200° C. for 1 minute, and then the surface was observed with an optical microscope. In the observation, it was checked whether the decomposition product of the release layer was removed on the surface of the glass wafer. The results are shown in Table 2.

TABLE 2

| Example | Optimal irradiation amount (mJ/cm$^2$) | Releasing after whole surface irradiation possible/impossible | Residue on support substrate after cleaning with OK73 thinner |
|---|---|---|---|
| 2-1 | 150 | Possible | Non |
| 2-2 | 200 | Possible | Partly present (generally removable) |
| 2-3 | 200 | Possible | Non |

In Example 2-1, it was possible to easily perform releasing after whole surface irradiation, and it was possible to remove the decomposition product after laser releasing with OK73 thinner.

In Example 2-2, it was possible to easily perform releasing after whole surface irradiation. It was possible to partly remove the decomposition product after laser releasing with OK73 thinner. When the entire substrate was observed, the residue partly remained in some portions, which was not a problem.

In Example 2-3, it was possible to easily perform releasing after whole surface irradiation, and it was possible to remove the decomposition product after laser releasing with OK73 thinner.

In Example 2-1, when a silicon wafer and a glass wafer were bonded to each other using only the adhesive composition without using the release agent composition-1, releasing as seen in Examples 2-1 to 2-3 did not occur even when laser irradiation was performed.

REFERENCE SIGNS LIST

1 Semiconductor substrate
2 Adhesive layer
3 Release layer
4 Support substrate

The invention claimed is:

1. A laminate comprising:
a semiconductor substrate;
a support substrate that is light-transmissive; and
an adhesive layer and a release layer provided between the semiconductor substrate and the support substrate,
the laminate being used when the release layer absorbs light irradiated from a side of the support substrate and then the semiconductor substrate and the support substrate are separated from each other,
wherein
the release layer is formed from a release agent composition,
the release agent composition contains a light-absorbing compound having a molecular weight of 400 g/mol or more and 2,000 g/mol or less,
the light-absorbing compound has an aromatic hydrocarbon ring having at least one of a hydroxy group and an alkoxy group,
the light-absorbing compound has 4 or more and 10 or less of the aromatic hydrocarbon rings per molecular weight of 1,000 g/mol, and
when the light-absorbing compound is measured for an absorption spectrum in a range of 250 to 800 nm, the absorption spectrum has a local maximum value, which is a maximum absorbance in a range of 250 to 800 nm, between 250 nm and 350 nm.

2. The laminate according to claim 1, wherein, when a film of the light-absorbing compound having a thickness of 200 nm is measured for a transmission spectrum, the transmission spectrum has a transmittance of 30% or less at a wavelength showing the local maximum value.

3. The laminate according to claim 1, wherein the release agent composition contains the light-absorbing compound in an amount of 90 mass % or more with respect to a nonvolatile content in the release agent composition.

4. The laminate according to claim 1, wherein the adhesive layer is formed from an adhesive composition containing a compound having a siloxane structure.

5. The laminate according to claim 4, wherein the adhesive composition contains a component (A), which is curable.

6. The laminate according to claim 5, wherein the component (A) is cured through hydrosilylation reaction.

7. The laminate according to claim 5, wherein the component (A) includes:
a polyorganosiloxane (a1) having an alkenyl group bonded to a silicon atom and having 2 to 40 carbon atoms;
a polyorganosiloxane (a2) having an Si—H group; and
a platinum group metal-based catalyst (A2).

8. A release agent composition that is, in a laminate including a semiconductor substrate; a support substrate; and an adhesive layer and a release layer provided between the semiconductor substrate and the support substrate, and used when the release layer absorbs light irradiated from a side of the support substrate and then the semiconductor substrate and the support substrate are separated from each other, used for forming the release layer,
the release agent composition comprising: a light-absorbing compound having a molecular weight of 400 g/mol or more and 2,000 g/mol or less, the light-absorbing compound having an aromatic hydrocarbon ring having at least one of a hydroxy group and an alkoxy group, and the light-absorbing compound having 4 or more and 10 or less of the aromatic hydrocarbon rings per molecular weight of 1,000 g/mol, and
wherein, when the light-absorbing compound is measured for an absorption spectrum in a range of 250 to 800 nm, the absorption spectrum has a local maximum value, which is a maximum absorbance in a range of 250 to 800 nm, between 250 nm and 350 nm.

9. The release agent composition according to claim 8, wherein, when a film of the light-absorbing compound having a thickness of 200 nm is measured for a transmission spectrum, the transmission spectrum has a transmittance of 30% or less at a wavelength showing the local maximum value.

10. The release agent composition according to claim 8, wherein the light-absorbing compound is contained in an amount of 90 mass % or more with respect to a nonvolatile content in the release agent composition.

11. A method for producing a processed semiconductor substrate, the method comprising:
processing the semiconductor substrate of the laminate according to claim 1; and
separating the processed semiconductor substrate and the support substrate from each other.

12. The method for producing a processed semiconductor substrate according to claim 11, wherein the separating the processed semiconductor substrate and the support substrate from each other includes irradiating the release layer with light.

* * * * *